US010482812B1

(12) United States Patent
Zhai

(10) Patent No.: US 10,482,812 B1
(45) Date of Patent: Nov. 19, 2019

(54) LIGHT-EMITTING CONTROL SIGNAL GENERATION CIRCUIT, DISPLAY PANEL AND DISPLAY APPARATUS

(71) Applicant: Shanghai Tianma Micro-Electronics Co., Ltd., Shanghai (CN)

(72) Inventor: Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/227,283

(22) Filed: Dec. 20, 2018

(30) Foreign Application Priority Data

May 7, 2018 (CN) .......................... 2018 1 0426207

(51) Int. Cl.
*G09G 3/3225* (2016.01)
*H03K 3/017* (2006.01)

(52) U.S. Cl.
CPC .......... *G09G 3/3225* (2013.01); *H03K 3/017* (2013.01); *G09G 2310/0286* (2013.01); *G09G 2310/08* (2013.01); *G09G 2320/0233* (2013.01); *G09G 2320/064* (2013.01); *G09G 2330/021* (2013.01)

(58) Field of Classification Search
CPC ............. G09G 3/3208; G09G 2310/08; G09G 2320/064; H03K 3/017
See application file for complete search history.

(56) References Cited

U.S. PATENT DOCUMENTS

| 2018/0130407 | A1* | 5/2018 | Zhai | ...................... | G09G 3/3208 |
| 2019/0073933 | A1* | 3/2019 | Xuan | ....................... | G09G 3/20 |

FOREIGN PATENT DOCUMENTS

| CN | 106601177 A | 4/2017 |
| CN | 107424649 A | 12/2017 |
| CN | 107452351 A | 12/2017 |
| CN | 107657918 A | 2/2018 |
| CN | 107863057 A | 3/2018 |

* cited by examiner

*Primary Examiner* — Nelson M Rosario
(74) *Attorney, Agent, or Firm* — Anova Law Group PLLC

(57) ABSTRACT

A light-emitting control signal generation circuit, a display panel and a display apparatus are provided. The light-emitting control signal generation circuit includes a first control module, an interlocking stabilization module, a second control module and an output module. The display panel includes a cascade circuit including a plurality of light-emitting control signal generation circuits, and the display apparatus includes the display panel. The light-emitting control signal generation circuit has a simple circuit structure with four modules coordinating one another, such that a signal outputted by a signal output terminal has a same pulse width as an effective pulse signal supplied to a signal input terminal. By adjusting the pulse with of the effective input pulse signal, the pulse width of the output signal may be adjusted accordingly, thereby fulfilling various display needs for different brightness of the display panel and improving quality and flexibility of display images.

20 Claims, 15 Drawing Sheets

LIGHT-EMITTING CONTROL SIGNAL GENERATION CIRCUIT, DISPLAY PANEL AND DISPLAY APPARATUS

CROSS-REFERENCE TO RELATED APPLICATIONS

This application claims the priority of Chinese Patent Application No. 201810426207.3, filed on May 7, 2018, the entire contents of which are incorporated herein by reference.

FIELD OF THE DISCLOSURE

The present disclosure generally relates to the field of display technology and, more particularly, relates to a light-emitting control signal generation circuit, a display panel and a display apparatus.

BACKGROUND

In the existing flat-panel display technologies, organic electroluminescent display (OLED), as one type of a self-illuminous display device, possesses various advantages including low energy consumption, high color saturation and wide viewing angle. Therefore, OLED has gradually become a mainstream in the display field. To achieve a display function of an OLED display device, a light-emitting control signal is generally supplied to a display area of the OLED display device, thereby achieving the display of an image. By adjusting a pulse width of the light-emitting control signal, the OLED display device may be able to accommodate various display needs for different brightness.

Therefore, a technical problem to be resolved resides in the design of a light-emitting control signal generation circuit which outputs a stable pulse signal with an adjustable pulse width, such that it can fulfill various display needs for different brightness.

BRIEF SUMMARY OF THE DISCLOSURE

One aspect of the present disclosure provides a light-emitting control signal generation circuit, including a first control module, an interlocking stabilization module, a second control module and an output module. The first control module is configured to control a potential of a first node, under a control of an effective pulse signal inputted by a signal input terminal, a first clock signal inputted by a first clock signal terminal and a second clock signal inputted by a second clock signal terminal. The second control module is configured to control a potential of a second node, under a control of the first clock signal inputted by the first clock signal terminal, the second clock signal inputted by the second clock signal terminal, a first voltage signal inputted by a first voltage signal terminal, a second voltage signal inputted by a second voltage signal terminal and the potential of the first node. The interlocking stabilization module, under a control of the second voltage signal inputted by the second voltage signal terminal, is configured to maintain and control a potential of a third node. The output module is configured to transmit the first voltage signal inputted by the first voltage signal terminal to a signal output terminal under a control of the potential of the first node and the potential of the third node, and to transmit the second voltage signal inputted by the second voltage signal terminal to the signal output terminal under a control of a potential of the second node.

Another aspect of the present disclosure provides a display panel, including a cascade circuit including a plurality of light-emitting control signal generation circuits. Except for a last level of light-emitting control signal generation circuit within the cascade circuit, a signal output terminal of each level of light-emitting control signal generation circuit is electrically connected to a signal input terminal of a next level of light-emitting control signal generation circuit, and an initiating pulse signal is supplied to a signal input terminal of a first level of light-emitting control signal generation circuit.

Another aspect of the present disclosure provides a display apparatus, including the display panels as described in the present disclosure.

Other features and advantages of the present disclosure will become more apparent via a reading of detailed descriptions of non-limiting embodiments with reference to the accompanying drawings.

BRIEF DESCRIPTION OF THE DRAWINGS

The accompanying drawings, illustrating some embodiments of the present disclosures, constitute a part of the present disclosure. These accompanying drawings together with some of the embodiments will be described in the following to illustrate the technical solutions of the present disclosure.

DETAILED DESCRIPTION

Figure 1:
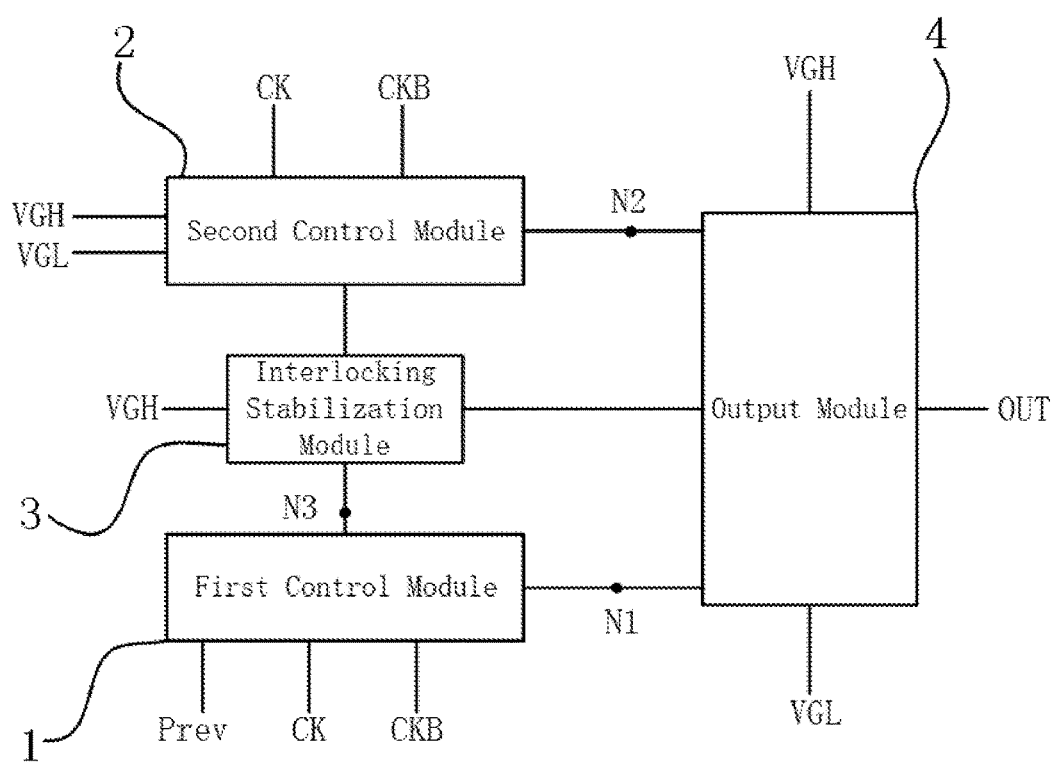
FIG. 1 illustrates a circuit schematic diagram of a first exemplary light-emitting control signal generation circuit according to various embodiments of the present disclosure.

Various embodiments of the present disclosure will be described in detail as follows with reference to the accompanying drawings. It should be noted that the arrangements of the elements and steps as described in these embodiments, as well as the numeric expressions and numeric values are not intended to limit the scope of the present disclosure, unless otherwise specified.

It should be understood that, the descriptions of exemplary embodiments disclosed herein are only for illustrative purpose, not intended to limit any scope of the embodiments of the present disclosure or the implementation of these embodiments.

The technologies, methods and devices that are known to one of ordinary skill in the art will not be described in detail herein, however under certain circumstances, any technology, method and device as disclosed herein should be viewed as part of the present disclosure.

Any numeric value described in exemplary embodiments of the present disclosure is only for illustrative purposes, not intended to be limiting. Accordingly, different numeric values may be applied in other exemplary embodiments of the present disclosure.

It should be noted that similar reference numerals and letters indicate similar items in the following drawings. Thus, once an item is defined in one drawing, it is unnecessary for the item to be further discussed in subsequent drawings.

The present disclosure provides a light-emitting control signal generation circuit, a display panel and a display apparatus. The light-emitting control signal generation circuit includes a first control module, an interlocking stabilization module, a second control module and an output module. The display panel includes a cascade circuit including a plurality of light-emitting control signal generation circuits, and the display apparatus includes the display panel. The light-emitting control signal generation circuit has a simple circuit structure with four modules coordinating one another, such that a signal outputted by a signal output terminal has a same pulse width as an effective pulse signal inputted by a signal input terminal. By adjusting the pulse with of the effective input pulse signal, the pulse width of the output signal may be adjusted accordingly, thereby fulfilling various display needs for different brightness of the display panel and maintaining the stability of the pulse width and potential of a scanning signal. As such, the display panel may have display images with better qualities and improved watching experience. Meanwhile, it may improve the flexibility of display images and reduce the power consumption of the display system.

With reference to FIG. 1, it illustrates a circuit schematic diagram of a first exemplary light-emitting control signal generation circuit according to the embodiments of the present disclosure. The exemplary light-emitting control signal generation circuit described in the present disclosure includes a first control module 1, a second control module 2, an interlocking stabilization module 3 and an output module 4.

The first control module 1, is configured to control a potential of a first node N1, under a control of an effective pulse signal inputted by a signal input terminal Prev, a first clock signal inputted by a first clock signal terminal CK and a second clock terminal inputted by a second clock signal terminal CKB.

The second control module 2, is configured to control a potential of a second node N2, under a control of the first clock signal inputted by the first clock signal terminal CK, the second clock signal inputted by the second clock signal terminal CKB, a first voltage signal inputted by a first voltage signal terminal VGL, a second voltage signal inputted by a second voltage signal terminal VGH and the potential of the first node N1.

The interlocking stabilization module 3, under a control of the second voltage signal inputted by the second voltage signal terminal VGH, is configured to stably control a potential of a third node N3.

The output module 4, is configured to transmit the first voltage signal inputted by the first voltage signal terminal VGL to an signal output terminal OUT, under a control of the potential of the first node N1 and the potential of the third node N3, and to transmit the second voltage signal inputted by the second voltage signal terminal VGH to the signal output terminal OUT, under a control of the potential of the second node N2.

According to the embodiments of the present disclosure, the exemplary light-emitting control signal generation circuit has a simple circuit structure, with the first control module 1, the second control module 2 and the output module 4 coordinating one another, such that the signal output terminal OUT may output a signal having a same pulse width as the effective pulse signal inputted by the signal input terminal Prev. By adjusting the pulse with of the effective input pulse signal, the pulse width of the output signal may be adjusted accordingly, thereby fulfilling various display needs for different brightness of the display panel. Furthermore, the circuit structure of the interlocking stabilization module 3 may maintain the stability of a pulse width and potential of a scanning signal, thereby maintaining the stability of the pulse width and potential of the light-emitting control signal, such that the display panel may have display images with better quality and improved watching experience.

Figure 2:
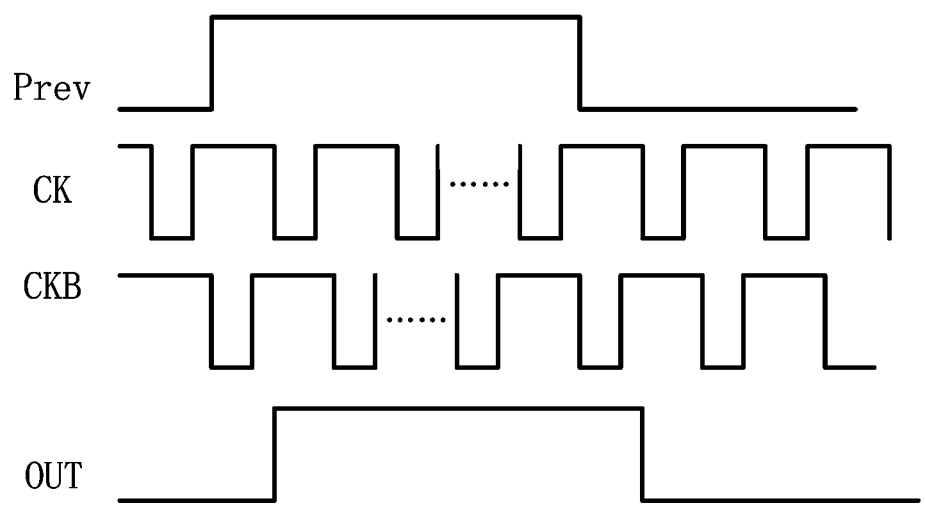
FIG. 2 illustrates an input and output timing diagram corresponding to the exemplary circuit connection structure illustrated in FIG. 1.

With reference to FIG. 2 according to some optional embodiments of the present disclosure, FIG. 2 illustrates an input and output timing diagram corresponding to the exemplary circuit connection structure illustrated in FIG. 1. In the exemplary embodiment of the present disclosure, the effective pulse signal inputted by the signal input terminal Prev is a high level signal, and both a rising edge and a falling edge of an effective pulse signal outputted by the signal output terminal OUT are aligned with a falling edge of the clock signal inputted by the first clock signal terminal CK.

The exemplary embodiments of the present disclosure may control the pulse width of the effective pulse signal outputted by the signal output terminal OUT, by adjusting the pulse width of the effective pulse signal inputted by the signal input terminal Prev, thereby achieving the adjustment of the pulse width of the output signal.

With reference to FIG. 2 according to some optional embodiments of the present disclosure, the pulse width of the effective pulse signal inputted by the signal input terminal Prev is an integer multiple of a pulse width of a clock signal cycle inputted by the first clock signal terminal CK and the second clock signal terminal CKB.

According to the embodiments of the present disclosure, in order to ensure that the effective output pulse signal has a same pulse width as the effective input pulse signal, the pulse width of the effective pulse signal inputted by the signal input terminal Prev may be an integer multiple of the pulse width of the clock signal cycle inputted by the first clock signal terminal CK and the second clock signal terminal CKB. Apparently, the pulse width of the effective pulse signal inputted by the signal input terminal Prev may be one-fold, two-fold, three-fold or other fold of the pulse width of the clock signal cycle inputted by the first clock signal terminal CK and the second clock signal terminal CKB. It may be necessary to implement the arrangements correspondingly based on practical applications, thereby ensuring the pulse width of the effective output pulse signal is the same as the pulse width of the effective input pulse signal. Nevertheless, the detailed arrangements will not be For example limited herein.

With reference to FIG. 2 according to some optional embodiments of the present disclosure, an extending cycle of the effective pulse signal inputted by the signal input terminal Prev is the same as an extending cycle of the effective pulse signal outputted by the signal output terminal OUT.

In the embodiments of the present disclosure, the extending cycle of the effective pulse signal inputted by the signal input terminal Prev is the same as the extending cycle of the effective pulse signal outputted by the signal output terminal OUT. That is, if the effective pulse signal inputted by the signal input terminal Prev was extended by M numbers of clock cycles, the effective pulse signal outputted by the signal output terminal OUT may also be extended by M numbers of clock cycles correspondingly, where M is a positive integer. Based on such, the duration of the effective pulse signal outputted by the signal output terminal OUT may be controlled by changing the duration of effective pulse signal inputted by the signal input terminal Prev. That is, the pulse width of the effective output pulse signal may be controlled by changing the pulse width of the effective input pulse signal, thereby improving the flexibility of the system while avoiding any change in the circuit structure or manufacture process.

With reference to FIG. 1 according to some optional embodiments of the present disclosure, a low level signal is inputted by the first voltage signal terminal VGL, and a high level signal is inputted by the second voltage signal terminal VGH.

In particular, to more clearly explain the light-emitting control signal generation circuit that may adjust the pulse width of the effective output pulse signal and maintain the stability of the potential of the output signal, the detailed structures and working mechanisms of several exemplary light-emitting control signal generation circuits will be described in detail as follows with reference to various embodiments of the present disclosure.

Figure 3:
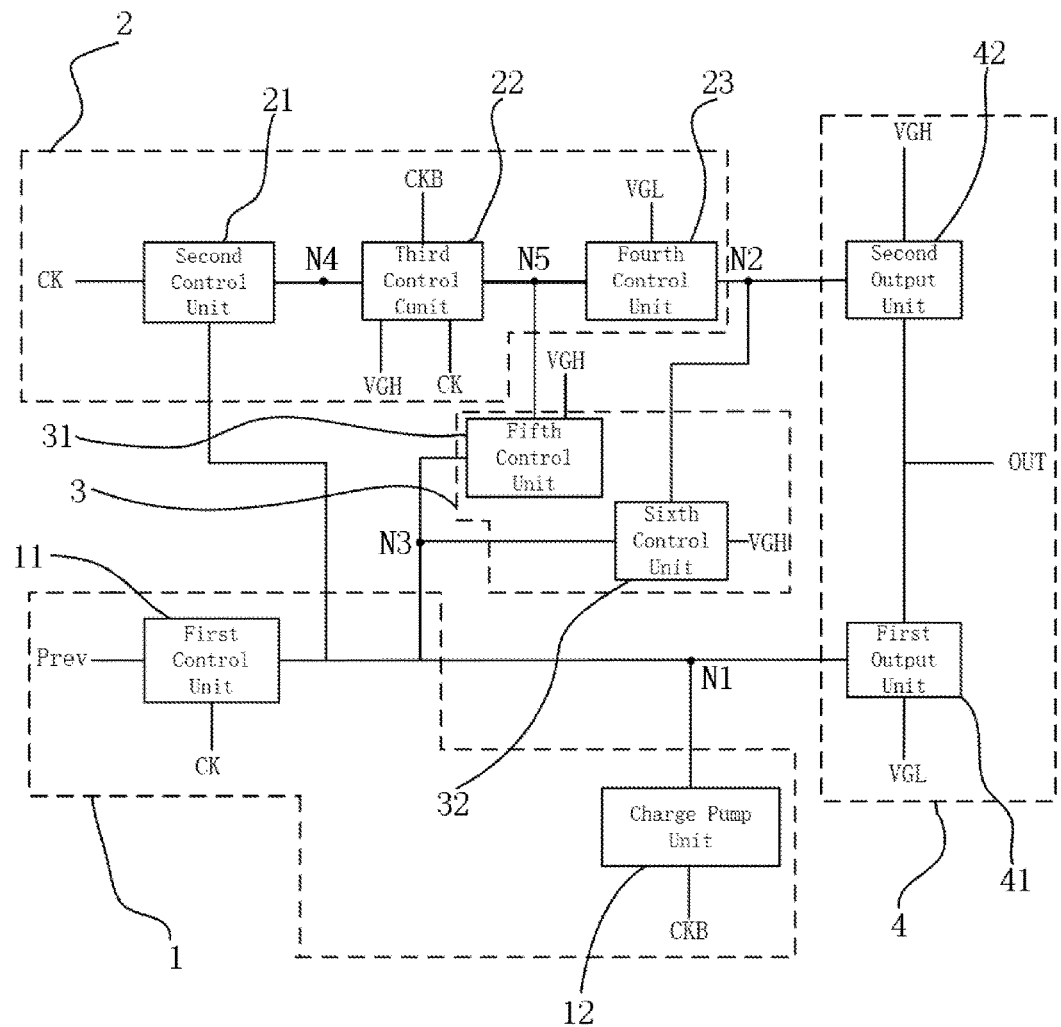
FIG. 3 illustrates a circuit schematic diagram of a second exemplary light-emitting control signal generation circuit according to the embodiments of the present disclosure.

With reference to FIG. 3 according to some optional embodiments of the present disclosure, it illustrates a circuit schematic diagram of a second exemplary light-emitting control signal generation circuit. To fulfill the function, the first control module 1 may include a first control unit 11 and a charge pump unit 12.

A first terminal of the first control unit 11 is electrically connected to the signal input terminal Prev, a second terminal of the first control unit 11 is electrically connected to the first clock terminal CK, and a third terminal of the first control unit 11 is electrically connected to the first node N1.

The first control unit 11, under the control of the first clock signal inputted by the first clock signal terminal CK, is configured to transmit the effective pulse signal inputted by the signal input terminal Prev to the first node N1.

A first terminal of the charge pump unit 12 is electrically connected to the second clock signal terminal CKB, and a second terminal of the charge pump unit 12 is electrically connected to the first node N1.

The charge pump unit 12, under the control of the second clock signal inputted by the second clock signal terminal CKB, is configured to strengthen the potential of the first node N1.

With reference to FIG. 3 according to some optional embodiments of the present disclosure, to fulfill the function, the second control module 2 may include a second control unit 21, a third control unit 22 and a fourth control unit 23.

A first terminal of the second control unit 21 is electrically connected to the first clock signal terminal CK, a second terminal of the second control unit 21 is electrically connected to the first node N1, and a third terminal of the second control unit 21 is electrically connected to a fourth node N4.

The second control unit 21 is configured to transmit the first clock signal inputted by the first clock signal terminal CK to the fourth node N4, under the control of the first clock signal inputted by the first clock signal terminal CK, and to transmit the first clock signal inputted by the first clock signal terminal CK to the fourth node N4, under the control of the potential of the first node N1.

A first terminal of the third control unit 22 is electrically connected to the fourth node N4, a second terminal of the third control unit 22 is electrically connected to the first clock signal terminal CK, a third terminal of the third control unit 22 is electrically connected to the second voltage signal terminal VGH, a fourth terminal of the third control unit 22 is electrically connected to the second clock signal terminal CKB, and a fifth terminal of the third control unit 22 is electrically connected to a fifth terminal N5.

The third control unit 22 is configured to transmit the second voltage signal inputted by the second voltage signal terminal VGH to the fifth terminal N5, under the control of the first clock signal inputted by the first clock signal terminal CK, and to transmit the second clock signal inputted by the second clock signal terminal CKB to the fifth terminal N5, under the control of the fourth node N4.

A first terminal of the fourth control unit 23 is electrically connected to the fifth node N5, a second terminal of the fourth control unit 23 is electrically connected to the first voltage signal terminal VGL, and a third terminal of the fourth control unit 23 is electrically connected to the second node N2.

The fourth control unit 23, under the control of a potential of the fifth node N5, is configured to transmit the first voltage signal inputted by the first voltage signal terminal VGL to the second node N2.

With reference to FIG. 3 according to some optional embodiments of the present disclosure, to fulfill the function, the interlocking stabilization module 3 may include a fifth control unit 31 and a sixth control unit 32.

A first terminal of the fifth control unit 31 is electrically connected to the second control module 2, a second terminal of the fifth control unit 31 is electrically connected to the second voltage signal VGH, and a third terminal of the fifth control unit 31 is electrically connected to the third node N3.

The fifth control unit 31, under the control of the second control module 2, is configured to transmit the second voltage signal inputted by the second voltage signal terminal VGH to the third node N3, thereby stabilizing the potential of the third node N3.

A first terminal of the sixth control unit 32 is electrically connected to the third node N3, a second terminal of the sixth control unit 32 is electrically connected to the second voltage signal terminal VGH, and a third terminal of the sixth control unit 32 is electrically connected to the second N2.

The sixth control unit 32, under the control of the potential of the third node N3, is configured to transmit the second voltage signal inputted by the second voltage signal terminal VGH to the second node N2.

With reference to FIG. 3 according to some optional embodiments of the present disclosure, to fulfill the function, the output module 4 may include a first output unit 41 and a second output unit 42.

A first terminal of the first output unit 41 is electrically connected to the first node N1, a second terminal of the first output unit 41 is electrically connected to the first voltage signal terminal VGL, and a third terminal of the first output unit 41 is electrically connected to the signal output terminal OUT.

The first output unit 41, under the control of the potential of the first node N1, is configured to transmit the first voltage signal inputted by the first voltage signal terminal VGL to the signal output terminal OUT.

A first terminal of the second output unit 42 is electrically connected to the second node N2, a second terminal of the second output unit 42 is electrically connected to the second voltage signal terminal VGH, and a third terminal of the second output unit 42 is electrically connected to the signal output terminal OUT.

The second output unit 42, under the control of the potential of the second node N2, is configured to transmit the second voltage signal inputted by the second voltage signal terminal VGH to the signal output terminal OUT.

Figure 4:
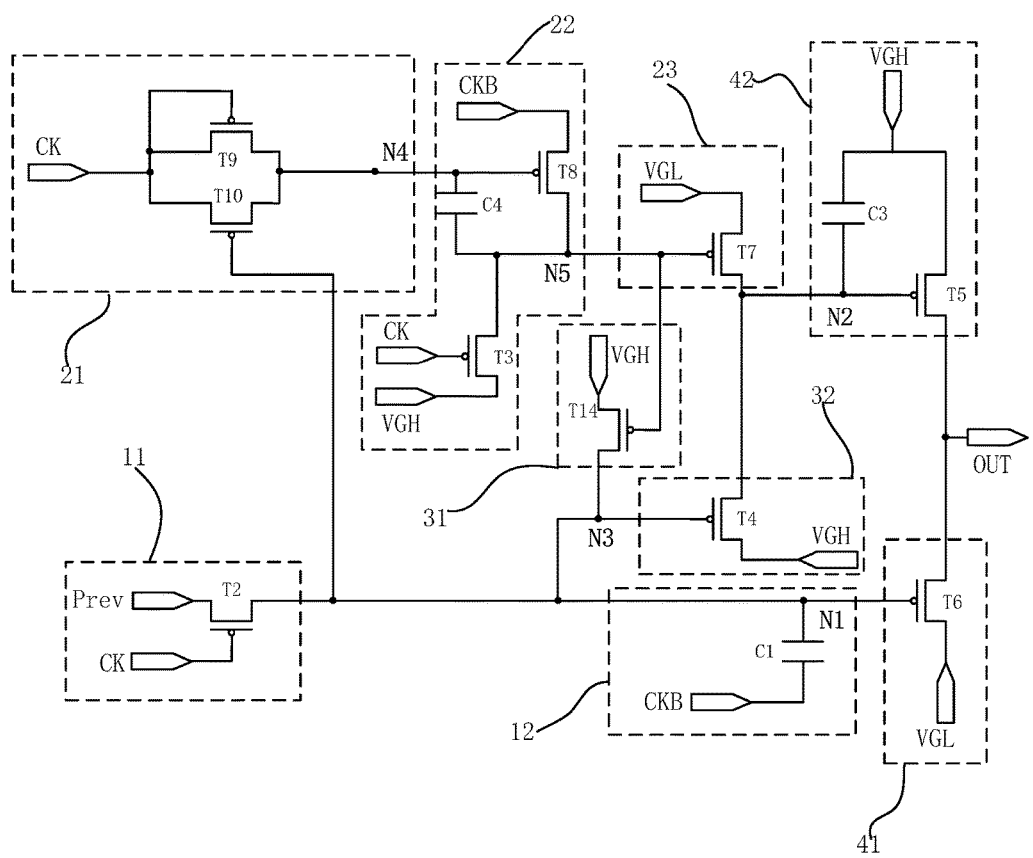
FIG. 4 illustrates a circuit schematic diagram of a third exemplary light-emitting control signal generation circuit according to the embodiments of the present disclosure.

With reference to FIG. 4 according to some optional embodiments of the present disclosure, it illustrates a circuit schematic diagram of a third exemplary light-emitting control signal generation circuit. To fulfill the function, the first control unit 11 may include a second switching transistor T2, where a gate electrode of the second switching transistor T2 is electrically connected to the first clock signal terminal CK, a source electrode of the second switching transistor T2 is electrically connected to the signal input terminal Prev, and a drain electrode of the second switching transistor T2 is electrically connected to the first node N1.

For example, the second switching transistor T2, under the control of the first clock signal inputted by the first clock signal terminal CK, is configured to transmit the effective pulse signal inputted by the signal input terminal Prev to the first node N1.

It should be noted that the second switching transistor T2 may be P-type transistor and the first clock signal inputted by the first clock signal terminal CK may be a low level signal. Alternatively, the second switching transistor T2 may be N-type transistor and the first clock signal inputted by the first clock signal terminal CK may be a high level signal.

It should also be noted that the exemplary structures of the first control unit 11 as described above are merely specified for illustrative purposes. During the implementation, the specific structures of the first control unit 11 are not limited by the aforementioned structures according to the embodiments of the present disclosure. Instead, the first control unit 11 may have some other structures readily known to one of ordinary skill in the art and will not be repeated herein.

With reference to FIG. 4 according to some optional embodiments of the present disclosure, to fulfill the function, the charge pump unit 12 may include a first capacitor C1, where a first terminal of the first capacitor C1 is electrically connected to the first node N1, and a second terminal of the first capacitor C1 is electrically connected to the second clock signal terminal CKB.

For example, the first capacitor C1, under the control of the second clock signal inputted by the second clock signal terminal CKB, is configured to maintain a voltage difference between its first terminal and second terminal, thereby strengthening the potential of the first node N1.

It should be noted that the exemplary structures of the charge pump unit 12 as described above are merely specified for illustrative purposes. During the implementation, the specific structures of the charge pump unit 12 is not limited by the aforementioned structures according to the embodiments of the present disclosure. Instead, the charge pump unit 12 may have some other suitable structures and will not be repeated herein.

It should also be noted that the output module 4, under the control of the potential of the first node N1, may transmit the first voltage signal inputted by the first voltage signal terminal VGL to the signal output terminal OUT. Accordingly, it may be required that the first control unit 11 and the charge pump unit 12 coordinating with one another, thereby controlling the potential of the first node N1 and ensuring a low potential signal outputted by the signal output terminal OUT. Furthermore, when the first node N1 has a low potential, the charge pump unit 12 may effectively maintain and strengthen the potential of the first node N1. Hence, it may avoid any fluctuation in the potential of the first node N1, since such fluctuation may prevent the signal output terminal OUT of the output module 4 from outputting a stable low potential signal.

With reference to FIG. 4 according to some optional embodiments of the present disclosure, to fulfill the function, the second control unit 21 may include a ninth switching transistor T9 and a tenth switching transistor T10, where both a gate electrode and a source electrode of the ninth switching transistor T9 are electrically connected to the first clock signal terminal CK, and a drain electrode of the ninth switching transistor T9 is electrically connected to the fourth node N4. A gate electrode of the tenth switching transistor T10 is electrically connected to the first node N1, a source electrode of the tenth switching transistor T10 is electrically connected to the first clock signal terminal CK, and a drain electrode of the tenth switching transistor T10 is electrically connected to the fourth node N4.

For example, the ninth switching transistor T9, under the control of the first clock signal inputted by the first clock signal terminal CK, is configured to transmit the first clock signal inputted by the first clock signal terminal CK to the fourth node N4. The tenth switching transistor T10, under the control of the potential of the first node N1, is configured to transmit the first clock signal inputted by the first clock signal terminal CK to the fourth node N4.

It should be noted that both the ninth switching transistor T9 and the tenth switching transistor T10 may be P-type transistors, the first clock signal inputted by the first clock signal terminal CK may be a low level signal and the first node N1 may have a low potential. Alternatively, the ninth switching transistor T9 and the tenth switching transistor T10 may be N-type transistors, the first clock signal inputted by the first clock signal terminal CK may be a high level signal and the first node N1 may have a high potential.

It should also be noted that the exemplary structures of the second control unit 21 as described above are merely specified for illustrative purposes. During the implementation, the specific structures of the second control unit 21 are not limited by the aforementioned structures according to the embodiments of the present disclosure. Instead, the second control unit 21 may have some other suitable structures and will not be repeated herein.

With reference to FIG. 4 according to some optional embodiments of the present disclosure, to fulfill the function, the third control unit may include a third switching transistor T3, an eighth switching transistor T8 and a fourth capacitor C4. A gate electrode of the third switching transistor T3 is electrically connected to the first clock signal terminal CK, a source electrode of the third switching transistor T3 is electrically connected to the second voltage signal terminal VGH, and a drain electrode of the third switching transistor T3 is electrically connected to the fifth node N5. A gate electrode of the eighth switching transistor T8 is electrically connected to the fourth node N4, a source electrode of the eighth switching transistor T8 is electrically connected to the second clock signal terminal CKB, and a drain electrode of the eighth switching transistor T8 is electrically connected to the fifth node N5, and further electrically connected to the gate electrode of the eighth switching transistor T8 through the fourth capacitor C4.

For example, the eighth switching transistor T8, under the control of a potential of the fourth node N4, is configured to transmit the second clock signal inputted by the second clock signal terminal CKB to the fifth node N5. The third switching transistor T3, under the control of the first clock signal inputted by the first clock signal terminal CK, is configured to transmit the second voltage signal inputted by the second voltage signal terminal VGH to the fifth node N5. The fourth capacitor C4 is configured to maintain a voltage difference between the fourth node N4 and the fifth node N5.

It should be noted that both the third switching transistor T3 and the eighth switching transistor T8 may be P-type transistors, the first clock signal inputted by the first clock signal terminal CK may be a low level signal and the fourth node N4 may have a low potential. Alternatively, the third switching transistor T3 and the eighth switching transistor T8 may be N-type transistors, the first clock signal inputted by the first clock signal terminal CK may be a high level signal and the fourth node N4 may have a high potential.

It should also be noted that the exemplary structures of the third control unit 22 as described above are merely specified for illustrative purposes. During the implementation, the specific structures of the third control unit 22 are not limited by the aforementioned structures according to the embodiments of the present disclosure. Instead, the third control unit 22 may have some other structures readily known to one with ordinary skill in the art and will not be repeated herein.

With reference to FIG. 4 according to some optional embodiments of the present disclosure, to fulfill the function, the fourth control unit 23 may include a seventh switching transistor T7, where a gate electrode of the seventh switching transistor T7 is electrically connected to the fifth node N5, a source electrode of the seventh switching transistor T7 is electrically connected to the first voltage signal terminal VGL, and a drain electrode of the seventh switching transistor T7 is electrically connected to the second node N2.

For example, the seventh switching transistor T7, under the control of the potential of the fifth node N5, is configured to transmit the first voltage signal inputted by the first voltage signal terminal VGL to the second node N2.

It should be noted that the seventh switching transistor T7 may be P-type transistor and the fifth node N5 may have a low potential. Alternatively, the seventh switching transistor T7 may be N-type transistor and the fifth node N5 may have a high potential.

It should also be noted that the exemplary structures of the fourth control unit 23 as described above are merely specified for illustrative purposes. During the implementation, the specific structures of the fourth control unit 23 are not limited by the aforementioned structures according to the embodiments of the present disclosure. Instead, the fourth control unit 23 may have some other structures readily known to one with ordinary skill in the art and will not be repeated herein.

With reference to FIG. 4 according to some optional embodiments of the present disclosure, to fulfill the function, the fifth control unit 31 may include a fourteenth switching transistor T14, where a gate electrode of the fourteenth switching transistor T14 is electrically connected to the second control module 2, a source electrode of the fourteenth switching transistor T14 is electrically connected to the second voltage signal terminal VGH, and a drain electrode of the fourteenth switching transistor T14 is electrically connected to the third node N3.

For example, the fourteenth switching transistor T14, under the control of the potential of the fifth node N5, is configured to transmit the second voltage signal inputted by the second voltage signal terminal VGH to the third node N3. Furthermore, the fourteenth switching transistor T14 is configured to ensure a high potential of the third node N3 when the fifth node N5 has a low potential. It may prevent the potential of the third node N3 from being floating during a last stage when the first clock signal inputted by the first clock signal terminal CK has a high level which in turn causes the cut-off of the second switching transistor T2.

It should be noted that the fourteenth switching transistor T14 may be P-type transistor and the fifth node N5 may have a low potential. Alternatively, the fourteenth switching transistor T14 may be N-type transistor and the fifth node N5 may have a high potential.

It should also be noted that the exemplary structures of the fifth control unit 31 as described above are merely specified for illustrative purposes. During the implementation, the specific structures of the fifth control unit 31 are not limited by the aforementioned structures according to the embodiments of the present disclosure. Instead, the fifth control unit 31 may have some other structures readily known to one with ordinary skill in the art and will not be repeated herein.

With reference to FIG. 4 according to some optional embodiments of the present disclosure, to fulfill the function, the sixth control unit 32 may include a fourth switching transistor T4, where a gate electrode of the fourth switching transistor T4 is electrically connected to the third node N3, a source electrode of the fourth switching transistor T4 is electrically connected to the second voltage signal terminal VGH, and a drain electrode of the fourth switching transistor T4 is electrically connected to the second node N2.

For example, the fourth switching transistor T4, under the control of the potential of the first node N1, is configured to transmit the second voltage signal inputted by the second voltage signal terminal VGH to the second node N2.

It should be noted that the fourth switching transistor T4 may be P-type transistor and the first node N1 may have a low potential. Alternatively, the fourth switching transistor T4 may be N-type transistor and the first node N1 may have a high potential.

It should also be noted that the exemplary structures of the sixth control unit 32 as described above are merely specified for illustrative purposes. During the implementation, the specific structures of the sixth control unit 32 are not limited by the aforementioned structures according to the embodiments of the present disclosure. Instead, the sixth control unit 32 may have some other structures readily known to one with ordinary skill in the art and will not be repeated herein.

With reference to FIG. 4 according to some optional embodiments of the present disclosure, to fulfill the function, the first output unit 41 may include a sixth switching transistor T6, where a gate electrode of the sixth switching transistor T6 is electrically connected to the first node N1, a source electrode of the sixth switching transistor T6 is electrically connected to the first voltage signal terminal VGL, and a drain electrode of the sixth switching transistor T6 is electrically connected to the signal output terminal OUT.

For example, the sixth switching transistor T6, under the control of the potential of the first node N1, is configured to transmit the first voltage signal inputted by the first voltage signal terminal VGL to the signal output terminal OUT.

It should be noted that the sixth switching transistor T6 may be P-type transistor and the first node N1 may have a low potential. Alternatively, the sixth switching transistor T6 may be N-type transistor and the first node N1 may have a high potential.

It should also be noted that the exemplary structures of the first output unit 41 as described above are merely specified for illustrative purposes. During the implementation, the specific structures of the first output unit 41 are not limited by the aforementioned structures according to the embodiments of the present disclosure. Instead, the first output unit 41 may have some other structures readily known to one with ordinary skill in the art and will not be repeated herein.

With reference to FIG. 4 according to some optional embodiments of the present disclosure, to fulfill the function, the second output unit 42 may include a fifth switching transistor T5 and a third capacitor C3. A gate electrode of the fifth switching transistor T5 is electrically connected to the second node N2, and further electrically connected to the second voltage signal terminal VGH through the third capacitor C3, a source electrode of the fifth switching transistor T5 is electrically connected to the second voltage signal terminal VGH, and a drain electrode of the fifth switching transistor T5 is electrically connected to the signal output terminal OUT.

For example, the fifth switching transistor T5, under the control of the potential of the second node N2, is configured to transmit the second voltage signal inputted by the second voltage signal terminal VGH to the signal output terminal OUT. The third capacitor C3, under the function of the second voltage signal inputted by the second voltage signal terminal VGH, is configured to maintain the potential of the second node N2.

It should be noted that the fifth switching transistor T5 may be P-type transistor and the second node N2 may have a low potential. Alternatively, the fifth switching transistor T5 may be N-type transistor and the second node N2 may have a high potential.

It should also be noted that the exemplary structures of the second output unit 42 as described above are merely specified for illustrative purposes. During the implementation, the specific structures of the second output unit 42 are not limited by the aforementioned structures according to the embodiments of the present disclosure. Instead, the second output unit 42 may have some other structures readily known to one with ordinary skill in the art and will not be repeated herein.

Figure 5:
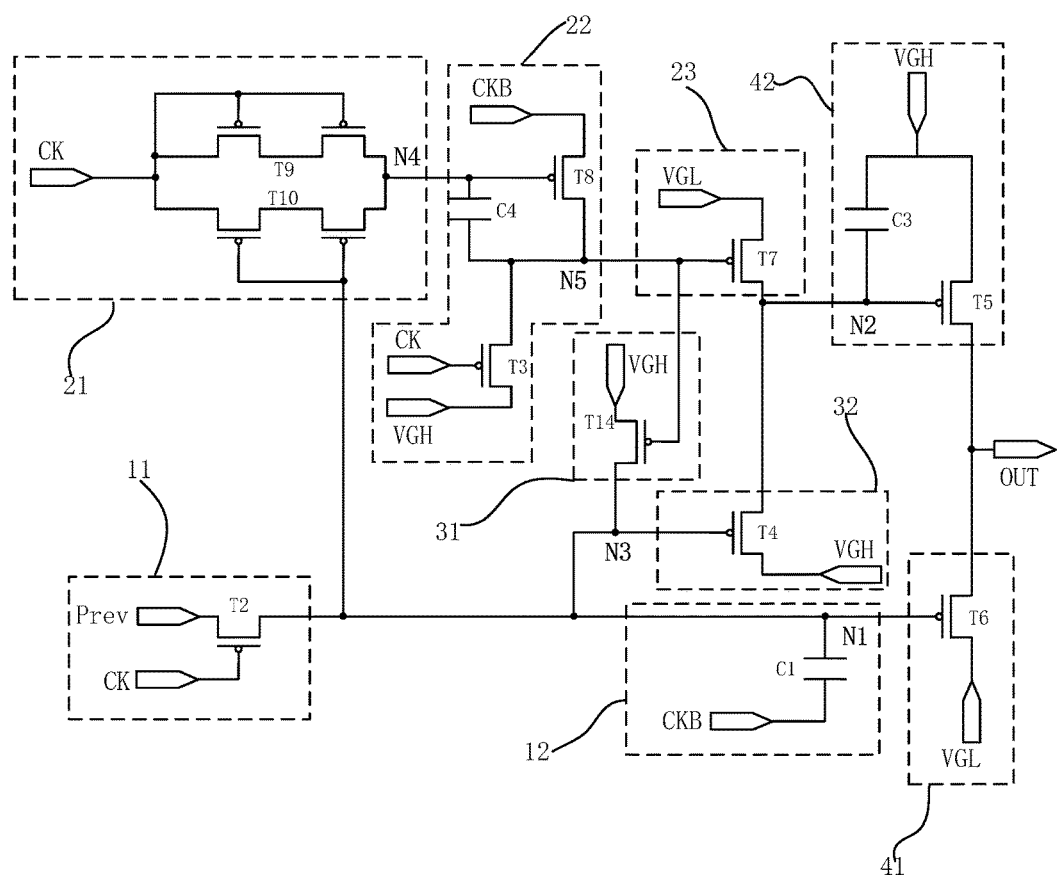
FIG. 5 illustrates a circuit schematic diagram of a fourth exemplary light-emitting control signal generation circuit according to the embodiments of the present disclosure.

With reference to FIG. 5 according to some optional embodiments of the present disclosure, it illustrates a circuit schematic diagram of a fourth exemplary light-emitting control signal generation circuit according to the embodiments of the present disclosure. To reduce the leakage currents of the ninth switching transistor T9 and the tenth switching transistor T10 thereby improving the stability of the light-emitting control signal generation circuit, both the ninth switching transistor T9 and the tenth switching transistor T10 may be double-gate transistors. A first gate electrode and a second gate electrode of the ninth switching transistor T9 are electrically connected to the first clock signal terminal CK, a source electrode of the ninth switching transistor T9 is electrically connected to the first clock signal terminal CK, and a drain electrode of the ninth switching transistor T9 is electrically connected to the fourth node N4. A first gate electrode and a second gate electrode of the tenth switching transistor T10 are electrically connected to the first node N1, a source electrode of the tenth switching transistor T10 is electrically connected to the first clock signal terminal CK, and a drain electrode of the tenth switching transistor T10 is electrically connected to the fourth node N4.

For example, the ninth switching transistor T9, under the control of the first clock signal inputted by the first clock signal terminal CK, is configured to transmit the first clock signal inputted by the first clock signal terminal CK to the fourth node N4. The tenth switching transistor T10, under the control of the potential of the first node N1, is configured to transmit the first clock signal inputted by the first clock signal terminal CK to the fourth node N4.

Figure 6:
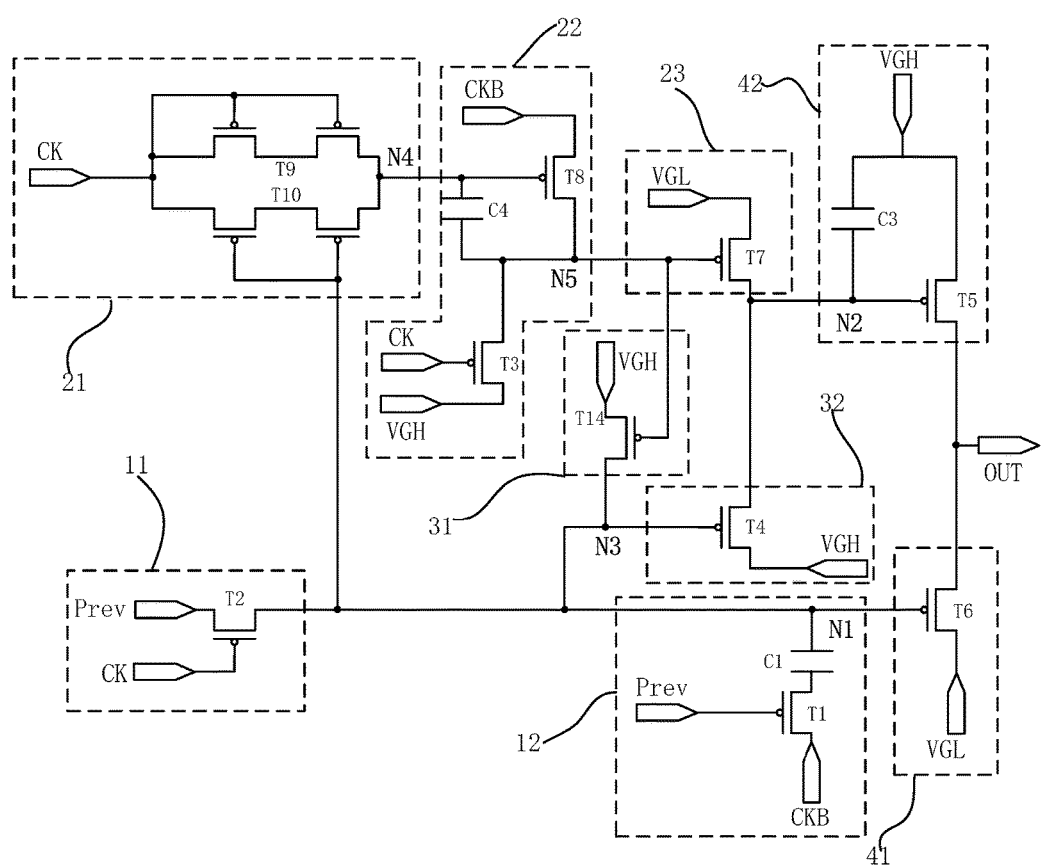
FIG. 6 illustrates a circuit schematic diagram of a fifth exemplary light-emitting control signal generation circuit according to the embodiments of the present disclosure.

With reference to FIG. 6 according to some optional embodiments of the present disclosure, it illustrates a circuit schematic diagram of a fifth exemplary light-emitting control signal generation circuit according to the embodiments of the present disclosure. To further realize the function of the charge pump unit 12 and reduce the crosstalk within the circuit, the charge pump unit 12 may further include a first switching transistor T1, where a gate electrode of the first switching transistor T1 is electrically connected to the signal input terminal Prev, a source electrode of the first switching transistor T1 is electrically connected to the second clock signal terminal CKB, and a drain electrode of the first switching transistor T1 is electrically connected to the second terminal of the first capacitor C1. The first switching transistor T1, under the control of the effective pulse signal inputted by the signal input terminal Prev, is configured to transmit the second clock signal inputted by the second clock signal terminal CKB to the second terminal of the first capacitor C1, thereby further strengthening the potential of the first node N1.

For example, the first switching transistor T1, under the control of the effective pulse signal inputted by the signal input terminal Prev, is configured to transmit the second clock signal inputted by the second clock signal terminal CKB to the second terminal of the first capacitor C1. and the first capacitor C1 is configured to maintain a voltage difference between the first terminal and the second terminal, where the first terminal of the first capacitor C1 is the first node N1.

It should be noted that the first switching transistor T1 may be P-type transistor, and the effective pulse signal inputted by the signal input terminal Prev may have a low potential. Alternatively, the first switching transistor T1 may be N-type transistor, and the effective pulse signal inputted by the signal input terminal Prev may have a high potential.

Figure 7:
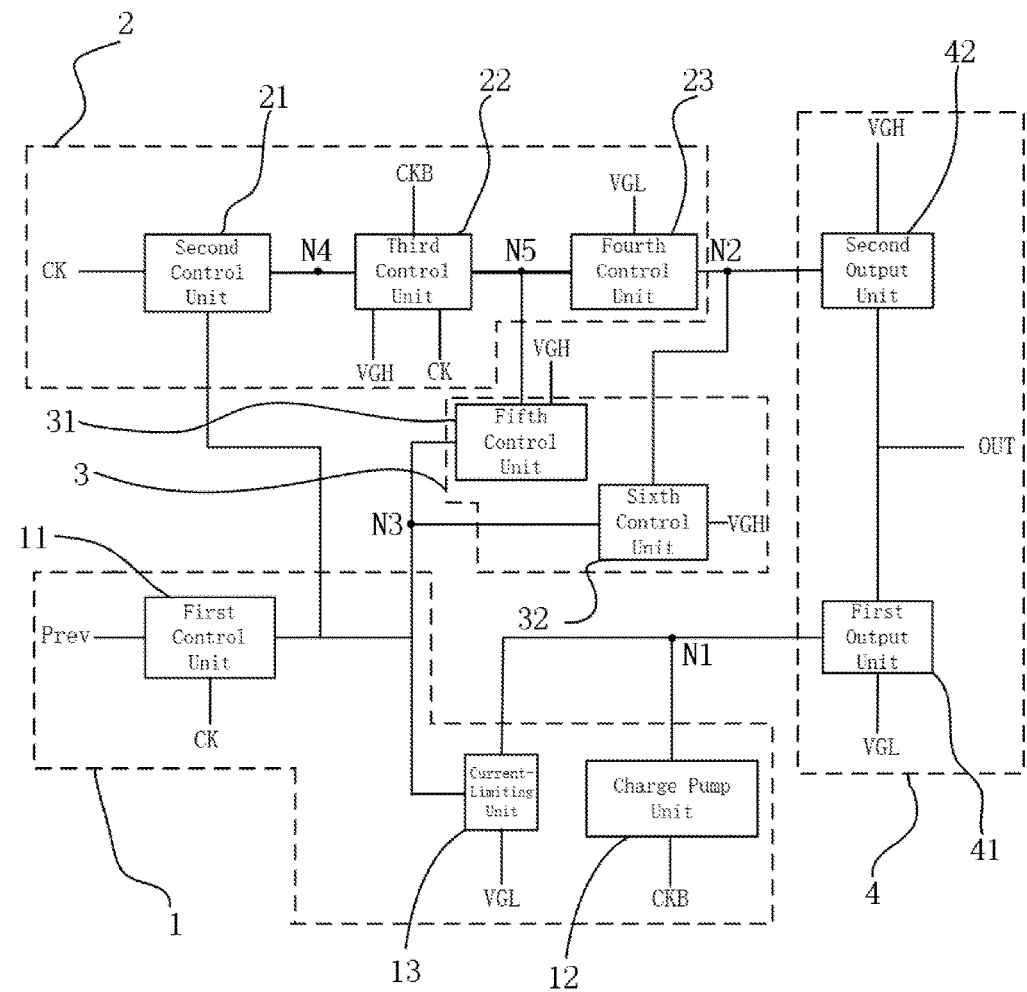
FIG. 7 illustrates a circuit schematic diagram of a sixth exemplary light-emitting control signal generation circuit according to the embodiments of the present disclosure.

With reference to FIG. 7 according to some optional embodiments of the present disclosure, it illustrates a circuit schematic diagram of a sixth exemplary light-emitting control signal generation circuit according to the embodiments of the present disclosure. To improve the current-limiting function of the first control unit 11, the first control module 1 may further include a current-limiting unit 13.

A first terminal of the current-limiting unit 13 is electrically connected to the first voltage signal terminal VGL, a second terminal of the current-limiting unit 13 is electrically connected to the third node N3, and a third terminal of the current-limiting unit 13 is electrically connected to the first node N1.

The current-limiting unit 13, under the control of the first voltage signal inputted by the first voltage signal terminal VGL, is configured to conduct the third terminal of the current-limiting unit 13 to the first node N1.

For example, the current-limiting unit 13 is arranged between the first control unit 11 and the charge pump unit 12, and the third node N3 is arranged at one side of the current-limiting unit 13 close to the first control unit 11, thereby preventing the interlocking stabilization module 3 from being adversely affected.

Figure 8:
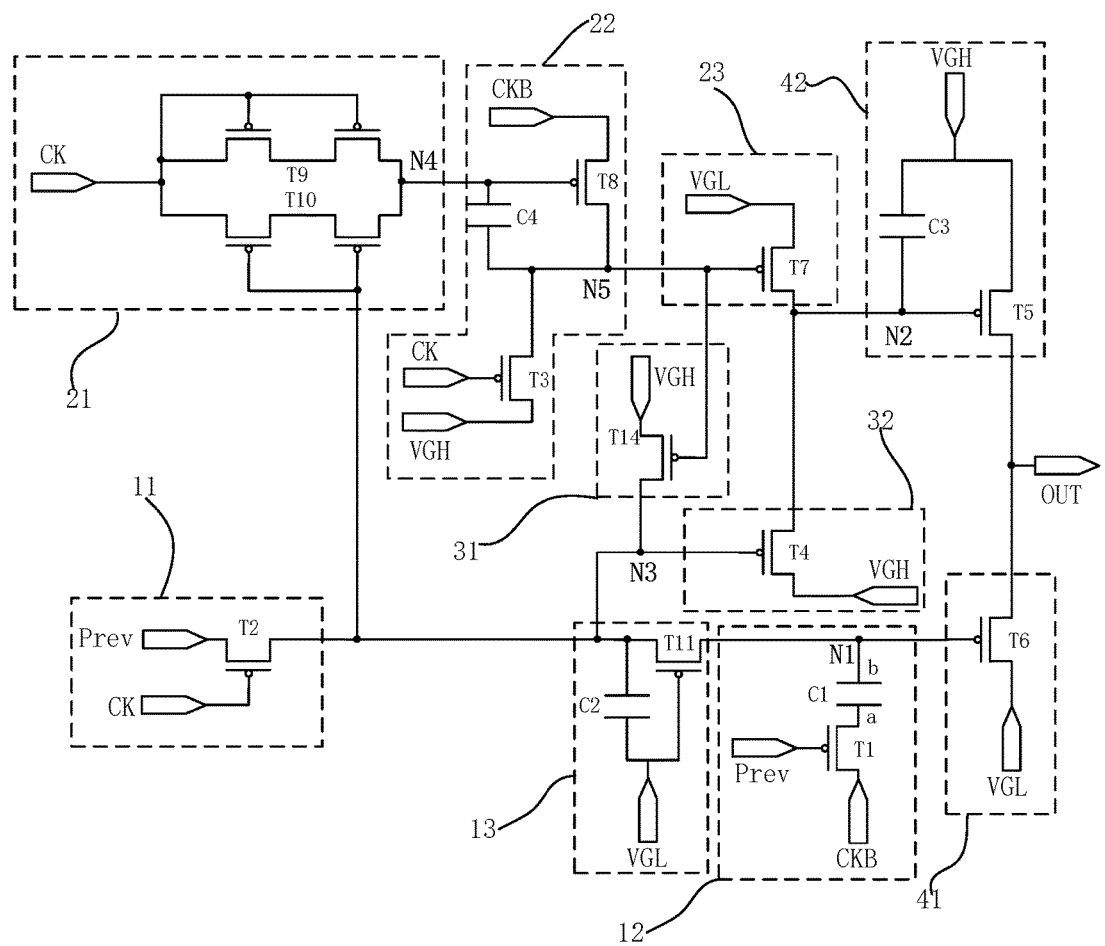
FIG. 8 illustrates a circuit schematic diagram of a seventh exemplary light-emitting control signal generation circuit according to the embodiments of the present disclosure.

With reference to FIG. 8 according to some optional embodiments of the present disclosure, it illustrates a circuit schematic diagram of a seventh exemplary light-emitting control signal generation circuit according to the embodiments of the present disclosure. To realize the function, the current-limiting unit 13 may include an eleventh switching transistor T11 and a second capacitor C2, where a gate electrode of the eleventh switching transistor T11 is electrically connected to the first voltage signal terminal VGL, a source electrode of the eleventh switching transistor T11 is electrically connected to the third node N3, and electrically connected to the gate electrode of the eleventh switching transistor T11 through the second capacitor C2, and a drain electrode of the eleventh switching transistor T11 is electrically connected to the first node N1.

For example, the eleventh switching transistor T11, under the control of the first voltage signal inputted by the first voltage signal terminal VGL, is configured to conduct the third node N3 to the first node N1. The second capacitor C2, under the function of the first voltage signal inputted by the first voltage signal terminal VGL, is configured to maintain the potential of the first node N1.

It should be noted that the eleventh switching transistor T11 may be P-type transistor and the first voltage signal inputted by the first voltage signal terminal VGL may be a low level signal. Alternatively, the eleventh switching transistor T11 may be N-type transistor and the first voltage signal inputted by the first voltage signal terminal VGL may be a high level signal.

It should also be noted that the exemplary structures of the current-limiting unit 13 as described above are merely specified for illustrative purposes. During the implementation, the specific structures of the current-limiting unit 13 are not limited by the above-mentioned structures according to the embodiments of the present disclosure. Instead, the current-limiting unit 13 may have some other structures readily known to one with ordinary skill in the art and will not be repeated herein.

It should be noted that although the switching transistors are P-type transistors as illustrated in FIG. 4-FIG. 8 according to the exemplary embodiments of the present disclosure, it is apparent to one with ordinary skill in the art that the switching transistors as illustrated in FIG. 4-FIG. 8 could be N-type transistors even if they were not shown in the drawings. It is also apparent to one with ordinary skill in the art to design a circuit using N-type transistors in view of the illustrations shown in FIG. 4-FIG. 8, which will not be further described herein. Furthermore, the switching transistors as described in the embodiments of the present disclosure may be low-temperature polysilicon thin-film transistors (TFT) or metal oxide semiconductor (MOS) field effect transistors, which will not be limited herein. Additionally, a source electrode and a gate electrode of each switching transistor as described in the embodiments of the present disclosure may be switched, which will not be differentiated herein.

A detailed description will be provided herein, explaining the working procedure and mechanism of the light-emitting control signal generation circuit together with exemplified working stages. The following detailed description may correspond to FIG. 8 which illustrates a circuit schematic diagram of a seventh exemplary light-emitting control signal generation circuit, and FIG. 9 which illustrates an input and output timing diagram according to the embodiments of the present disclosure. It should be noted in the following description, "1" indicates a high potential and "0" indicates a low potential, where both "1" are "0" are logic potentials with the illustrative purposes of describing the working mechanism of the circuit more clearly. Neither of them indicates a voltage value applied to the switching transistors during the implementation process.

During a t1 stage, Prev=0, CK=0, and CKB=1.

Since CK=0, both the third switching transistor T3 and the ninth switching transistor T9 are in a turn-on state for conduction. The ninth switching transistor T9 transmits the first clock signal inputted by the first clock signal terminal CK to the fourth node N4, such that the fourth node N4 has a low potential. The third switching transistor T3 transmits the second voltage signal inputted by the second voltage signal terminal VGH to the fifth node N5, such that the fifth node N5 has a high potential. Due to the high potential of the fifth node N5, accordingly, both the seventh switching transistor T7 and the fourteenth switching transistor T14 are in a cut-off state.

Since Prev=0, the first switching transistor T1 is in a turn-on state for conduction. The first switching transistor T1 transmits the second clock signal inputted by the second clock signal terminal CKB to terminal a of the first capacitor C1, such that the terminal a of the first capacitor C1 has a high potential, thereby strengthening a low potential of terminal b of the first capacitor C1, namely, a low potential of the first node N1.

Furthermore, since Prev=0 and CK=0, the second switching transistor T2 is in a turn-on state for conduction, transmitting the effective pulse signal inputted by the signal input terminal Prev to the third node N3, such that the third node N3 has a low potential which in turn makes the fourth switching transistor T4 in a turn-on state for conduction. The fourth switching transistor T4 transmits the second voltage signal inputted by the second voltage signal terminal VGH to the second node N2 and elevates the potential of the second node N2, thereby ensuring a cut-off state of the fifth switching transistor T5. Because of the low potential of the third node N3, the tenth switching transistor T10 is in a turn-on state for conduction and transmits the first clock signal inputted by the first clock signal terminal CK to the fourth node N4, thereby maintaining a low potential of the fourth node N4.

Since the gate electrode of the eleventh switching transistor T11 is electrically connected to the first voltage signal terminal VGL, the eleventh switching transistor T11 is kept in a turn-on state, which ensures the third node N3 and the first node N1 having the same low potential. Accordingly, the sixth switching transistor T6 is in a turn-on state for conduction and transmits the first voltage signal inputted by the first voltage signal terminal VGL to the signal output OUT, such that the signal output OUT outputs a low potential signal.

During a t2 stage, Prev=1, CK=1 and CKB=0.

Since CK=1, the second switching transistor T2, the third switching transistor T3 and the ninth switching transistor T9 are in a cut-off state. The third node N3 maintains a low potential, and the tenth switching transistor T10 is in a turn-on state for conduction. The tenth switching transistor T10 transmits the first clock signal inputted by the first signal terminal CK to the fourth node N4, such that the fourth node N4 has a high potential which in turn makes the eighth switching transistor T8 in a cut-off state. Because of the low potential of the third node N3, the fourth switching transistor T4 is in a turn-on state for conduction and transmits the second voltage signal inputted by the second voltage signal terminal VGH to the second node N2, thereby elevating the potential of the second node N2 which ensures a cut-off state of the fifth switching transistor T5.

Since Prev=1, the first switching transistor T1 is in a cut-off state, which maintains a stable low potential of the first node N1 without fluctuation. Meanwhile, the eleventh switching transistor T11 is in a turn-on state, further maintaining the low potential of the first node N1. The sixth switching transistor T6 keeps transmitting the first voltage signal inputted by the first voltage signal terminal VGL to the signal output terminal OUT, such that the signal output terminal OUT outputs a low potential signal.

During a t3 stage, Prev=1, CK=0 and CKB=1.

Since Prev=1, the first switching transistor T1 remains in a cut-off state. Furthermore, since CK=0, the second switching transistor T2 is in a turn-on state for conduction, elevating the potential of the third node N3. When the eleventh switching transistor T11 is in a turn-on state, the potential of the first node N1 is elevated. Because the first capacitor C1 maintains a voltage difference between the first node N1 and the terminal a of the first capacitor C1, the potential of the terminal a of the first capacitor C1 is decreased accordingly. Meanwhile, since the first switching transistor T1 is in a cut-off state, the terminal a of the first capacitor C1 maintains a low potential and the first node N1 maintains a high potential. The high potential of the first node N1 in turn makes the sixth switching transistor T6 in a cut-off state and stops transmitting a low potential signal to the signal output terminal OUT.

Furthermore, since Prev=1 and CK=0, the ninth switching transistor T9 is in a turn-on state for conduction and the tenth switching transistor T10 is in a cut-off state. As such, the fourth node N4 has a low potential and the eighth switching transistor T8 transmits the second clock signal inputted by the second clock signal terminal CKB to the fifth node N5. Since CKB=1, the fifth node N5 has a high potential. In addition, since CK=0, the third switching transistor T3 is in a turn-on state for conduction and the fifth node N5 keeps a high potential, which in turns maintains a cut-off state of the seventh switching transistor T7. Moreover, because the potential of the third node N3 is elevated, the fourth switching transistor T4 is switched from a turn-on state for conduction to a cut-off state. The change in the status of the fourth transistor T4 decreases the potential of the second node N2 to a low potential, which in turn makes the fifth switching transistor T5 in a turn-on state for conduction, transmitting the second voltage signal inputted by the second voltage signal terminal VGH to the signal output terminal OUT. Therefore, the signal output terminal OUT outputs a high potential signal.

During a t4 stage, Prev=1, CK=1 and CKB=0.

Since Prev=1, the first switching transistor T1 is kept in a cut-off state. Since CK=1, the second switching transistor T2 is also in a cut-off state. Meanwhile, the potentials of the third node N3, the first node N1 and the terminal a of the first capacitor C1, respectively, are kept consistent during this stage compared with during t3 stage. That is, the third node N3 and the first node N1 have a high potential, and the terminal a of the first capacitor C1 has a low potential, such that the sixth switching transistor T6 still maintains a cut-off state.

Furthermore, since CK=1, the ninth switching transistor T9 is in a cut-off state and the fourth node N4 still maintains a low potential. Accordingly, the eighth switching transistor T8 maintains a turn-on state for conduction and transmits the second clock signal inputted by the second clock signal terminal CKB to the fifth node N5. Since CKB=0, the fifth node N5 has a low potential which in turn makes the seventh switching transistor T7 in a turn-on state for conduction, transmitting the first voltage signal inputted by the first voltage signal terminal VGL to the second node N2. The second node N2 had a low potential during the t3 stage, and it maintains in the low potential under the bootstrapping function of the third capacitor C3 during the t4 stage. Accordingly, the fifth switching transistor T5 transmits the second voltage signal inputted by the second voltage signal terminal VGH to the signal output terminal OUT, such that the signal output terminal OUT continues outputting a high potential signal.

During a t5 stage, Prev=1, CK=0 and CKB=1.

Since Prev=1 and CKB=1, the first switching transistor T1 maintains a cut-off state. Meanwhile, since CK=0, the second switching transistor T2 changes into a turn-on state and maintains a high potential of the third node N3. Accordingly, the fourth switching transistor T4 maintains a cut-off state, preventing the second voltage signal inputted by the second voltage signal terminal VGH from being transmitted to the second node N2. The fifth switching transistor T5 maintains a turn-on state for conduction, ensuring the signal output terminal OUT outputs a high level signal without changing into a low potential signal in advance. Meanwhile, the third node N3 remains in a high potential, such that the first node N1 also maintains a high potential, while the terminal a of the first capacitor C1 maintains a low potential and the eleventh switching transistor T11 maintains in a turn-on state.

Furthermore, since CK=0, the fourth node N4 still maintains a low potential and the eighth switching transistor T8 keeps transmitting the second clock signal inputted by the second clock signal terminal CKB to the fifth node N5. Since CKB=1, the potential of the fifth node N5 has a high potential and the seventh switching transistor T7 switches from a turn-on state for conduction to a cut-off state. Moreover, during this stage, the second node N2 remains in a low potential consistent with that during the t4 stage, which in turn makes the fifth switching transistor T5 in a turn-on state for conduction such that T5 transmits the second voltage signal inputted by the second voltage signal terminal VGH to the signal output terminal OUT, thereby ensuring the signal output terminal OUT outputting a high potential signal.

During a t6 stage, Prev=0, CK=1 and CKB=0.

Since Prev=0 and CKB=0, even when the first switching transistor T1 changes to a turn-on state, the terminal a of the first capacitor C1 still has a low potential. Since CK=1, the second switching transistor T2 maintains a cut-off state, such that the first node N1 maintains a high potential and the sixth switching transistor T6 maintains a cut-off state. Due to the high potential of the first node N1, the eleventh switching transistor T11 maintains a turn-on state for conduction. Accordingly, the third node N3 maintains a high potential which in turn keeps the fourth switching transistor T4 maintain a cut-off state, thereby preventing the second voltage signal inputted by the second voltage signal terminal VGH from being transmitted to the second node N2. The fifth switching transistor T5 maintains a turn-on state for conduction, ensuring the signal output terminal OUT output a high potential signal without changing into low potential signal in advance.

Furthermore, since CK=1, both the second switching transistor T2 and the ninth switching transistor T9 are in a cut-off state, such that the fourth node N4 still maintains a low potential consistent with that during the t5 stage. The eighth switching transistor T8 keeps transmitting the second clock signal inputted by the second clock signal terminal CKB to the fifth node N5. Meanwhile, since CBK=0, the fifth node N5 has a low potential which makes the seventh switching transistor T7 in a turn-on state for conduction. The second node N2 still remains in a low potential which keeps the fifth switching transistor T5 in a turn-on state for conduction, such that T5 transmits the second clock signal inputted by the second clock signal terminal CKB to the signal output terminal OUT. Hence, the signal output terminal OUT outputs a high potential signal.

During this stage, the fifth node N5 has a low potential which in turn makes the fourteenth switching transistor T14 in a turn-on state for conduction. Accordingly, T14 transmits the second voltage signal inputted by the second voltage signal terminal VGH to the third node N3, thereby maintaining a high potential of the third node N3 and further ensuring the cut-off state of the sixth switching transistor T6. The cut-off state of the sixth switching transistor T6 prevents the first voltage signal inputted by the first voltage signal terminal VGL from being transmitted to the signal output OUT, avoiding any interference to the high potential signal outputted by the signal output terminal OUT.

During a t7 stage, Prev=0, CK=0 and CKB=1.

Since Prev=0 and CKB=1, the first switching transistor T1 is in a turn-on state and the potential of the terminal a of the first capacitor C1 is elevated. Furthermore, since CK=0, the second switching transistor T2 is in a turn-on state and the potential of the third node N3 is decreased. The eleventh switching transistor T11 is in a turn-on state and the potential of the first node N1 is decreased to a low level. Meanwhile, since CK=0, the third switching transistor T3 is in a turn-on state for conduction, and the fifth node N5 has a high potential which in turns makes the fourteenth switching transistor T14 in a cut-off state. The cut-off state of T14 prevents the second voltage signal inputted by the second voltage signal terminal VGH from being transmitted to the third node N3, such that the third node N3 maintains a low potential.

Furthermore, due to the function of the first capacitor C1, the first node N1 maintains a stable low potential, which in turn makes the sixth switching transistor T6 in a turn-on state for conduction, transmitting the first voltage signal inputted by the first voltage signal terminal VGL to the signal output terminal OUT. Therefore, the signal output terminal OUT outputs a low potential signal.

In addition, since the third node N3 has a low potential, the fourth switching transistor T4 maintains a turn-on state for conduction and transmits the second voltage signal inputted by the second voltage signal terminal VGH to the second node N2, elevating the potential of the second node N2. Such elevation in the potential makes the fifth switching transistor T5 in a cut-off state, which stops the transmission of the second voltage signal inputted by the second voltage signal terminal VGH to the signal output terminal OUT.

During a t8 stage, Prev=0, CK=1 and CKB=0.

Since Prev=0 and CKB=0, the first switching transistor T1 is in a turn-on state, which decreases the potential of the terminal a of the first capacitor C1 to a low level. Meanwhile, since CK=1, the second switching transistor T2 is in a cut-off state. Due to the function of the first capacitor C1, the potential of the first node N1 is further decreased in order to maintain a voltage difference between the two terminals of the first capacitor C1. Accordingly, the potential of the first node N1 is lower than the potential of the first voltage signal, which causes the eleventh switching transistor T11 change to a cut-off state. Hence, it ensures the signal output terminal OUT outputs a low potential signal, meanwhile, prevents other switching transistors from getting affected.

Since the third node N3 has a low potential, the fourth switching transistor T4 is in a turn-on state for conduction and transmits the second voltage signal inputted by the second voltage signal terminal VGH to the second node N2, thereby maintaining the high potential of the second node N2 and the cut-off state of the fifth switching transistor T5.

During a t9 stage, Prev=0, CK=0 and CKB=1.

Since Prev=0 and CKB=1, the first switching transistor T1 is in a turn-on state, elevating the potential of the terminal a of the first capacitor C1, and decreasing the potential of the first node N1 to a normal low value under the function of the first capacitor C1. In addition, since CK=0, the second switching transistor T2 is in a turn-on state and the third node N3 has a normal low potential which makes the eleventh switching transistor T11 in a turn-on state, thereby ensuring the normal operations of all switching transistors for repeating the process of stage t1.

Figure 10:
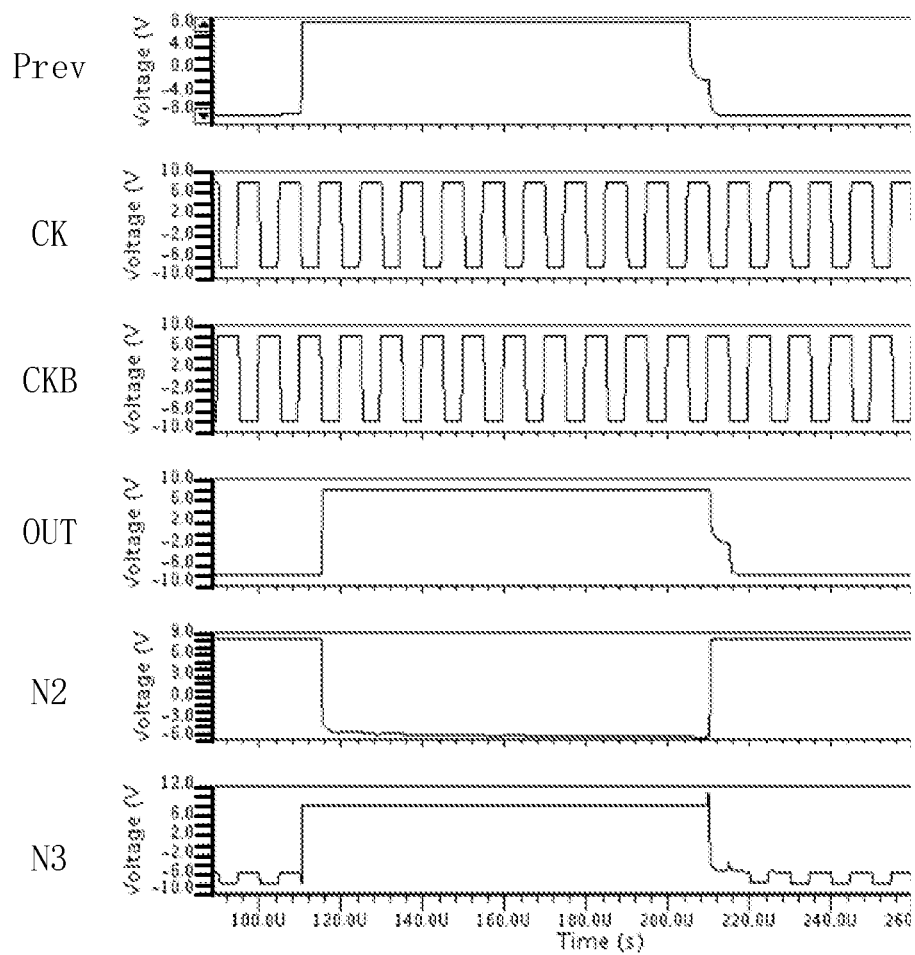
FIG. 10 illustrates simulation results corresponding to the exemplary light-emitting control signal generation circuit as shown in FIG. 8 according to the embodiments of the present disclosure.

As described above according to the embodiments of the present disclosure, stages t4 and t5 are two periods for maintaining the potential signals. With the arrangement of the light-emitting control signal generation circuit, the pulse width of the pulse signal inputted by the signal input terminal Prev determines the pulse width of the pulse signal outputted by the signal output terminal OUT. With reference to FIG. 10 which is the simulation results corresponding to the exemplary light-emitting control signal generation circuit as shown in FIG. 8, it demonstrates the above conclusions. As can be seen from the embodiments of the present disclosure, the light-emitting control signal generation circuit may adjust the pulse width of the pulse signal outputted by the signal output terminal OUT by setting up the pulse width of the pulse signal inputted by the signal input terminal Prev, based on different usage needs for the display panel to display various brightness. Furthermore, it may maintain the pulse width of the light-emitting control signal and the stability of the potential, such that display images of the display panel may have better quality and improved watching experience. Besides, the light-emitting control signal generation circuit may further improve the flexibility of display images and reduce the power consumption of the display system.

For example, when the signal output terminal OUT outputs a high potential signal and subsequently a low potential signal, the potential of the first node N1 may keep decreasing to be lower than the potential of the first voltage signal (namely, the potential of the gate electrode of the eleventh switching transistor T11), under the functions of the first switching transistor T1 and the first capacitor C1. Hence, the eleventh switching transistor T11 is in a cut-off state, thereby preventing the second switching transistor T2 and the fourth switching transistor T4 from being damaged and ensuring the normal operation of the light-emitting control signal generation circuit in order to realize the display function of the display panel.

The working period of the light-emitting control signal generation circuit according to the embodiments of the present disclosure may be divided into three stages, namely, Prev-input stage, signal storage stage and OUT-output stage.

First of all, an effective pulse signal is inputted into the signal input terminal Prev. The potential of the third node N3 is elevated and the second output unit 42 is turned off. Subsequently during the second half clock cycle, the potential of the second node N2 is decreased under the function of the second control module 2. Meanwhile, the second output unit 42 is turned on and the signal output terminal OUT outputs a high potential signal. After the effective pulse signal inputted by the signal input terminal Prev is maintained in a low potential level for half of the clock cycle, the potential of the third node N3 decreases to a low level, such that the first output unit 41 is turned on and the signal output terminal OUT outputs a low potential signal. Meanwhile, the potential of the second node N2 increases to a high level and the second output unit 42 is turned off.

Figure 9:
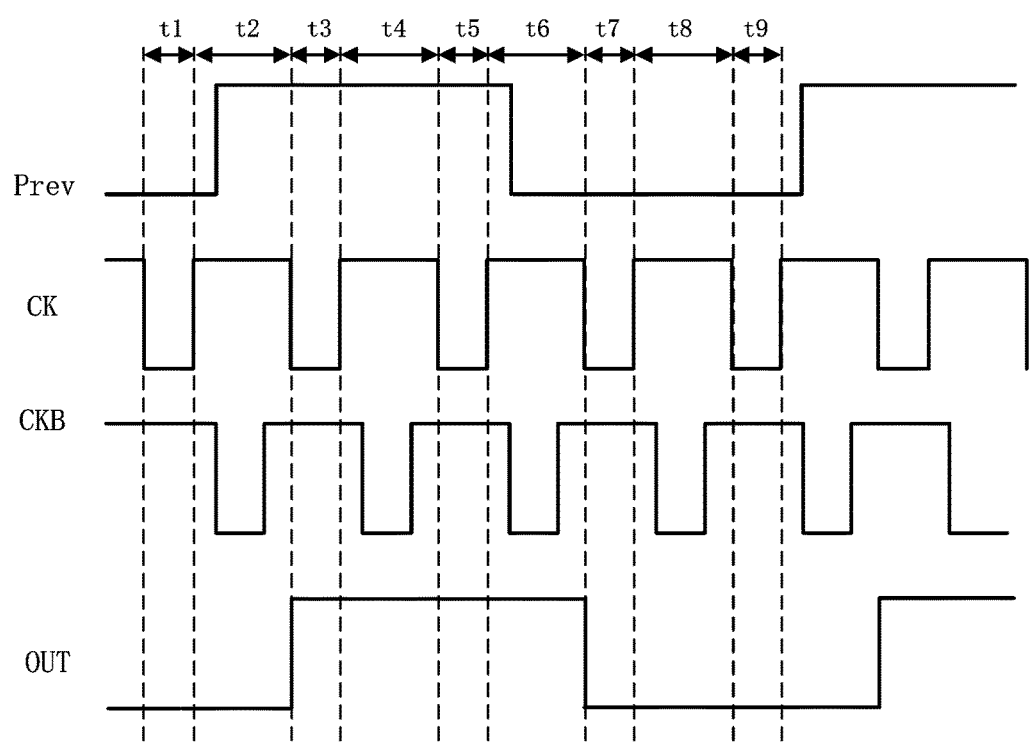
FIG. 9 illustrates an input and output timing diagram according to the embodiments of the present disclosure.
Figure 11:
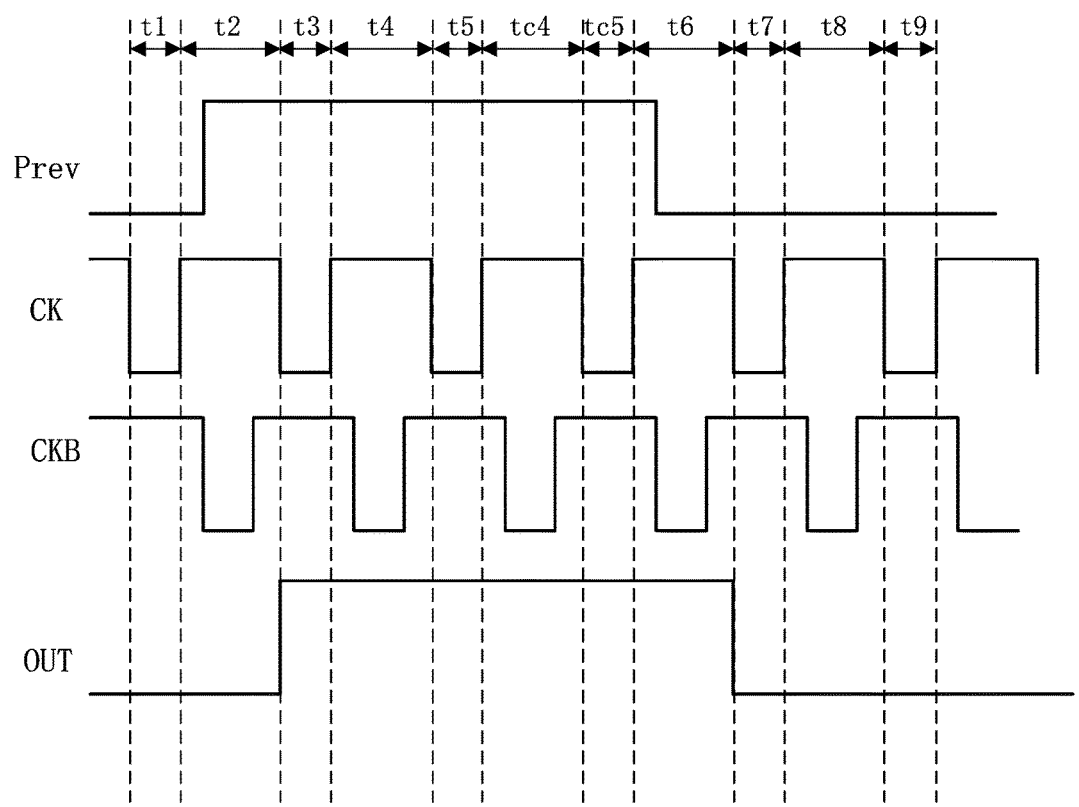
FIG. 11 illustrates another input and output timing diagram according to the embodiments of the present disclosure.

With reference to FIG. 11 according to some optional embodiments of the present disclosure, it illustrates another input and output timing diagram corresponding to the embodiments of the present disclosure. Two additional maintaining stages tc4 and tc5 are inserted between t3 stage and t6 stage. As of stages t1, t2, t3, t4, t5, t6, t7, t8 and t9 in FIG. 11, the operations and working processes of all the switching transistors and capacitors are consistent with the foregoing description in accompanying with the input and output timing diagram as shown in FIG. 9. The working process of the maintaining stage tc4 is consistent with stage t4, and similarly, the working process of the maintaining stage tc5 is consistent with stage t5. Therefore, the detailed working processes of the embodiments with reference to FIG. 11 will not be repeated herein.

For example, when at least two additional maintaining stages are inserted between stage t3 and stage t6, the effective output pulse signal may have the same pulse width as the effective input pulse signal in the exemplary light-emitting control signal generation circuit as illustrated in FIG. 8. The pulse width of the effective output pulse signal may be adjusted, by adjusting the pulse width of the effective input pulse signal, based on different usage needs for the display panel to display various brightness. As such, the exemplary light-emitting control signal generation circuit may accommodate different needs for displaying various brightness, and reduce the power consumption of the display system.

Figure 12:
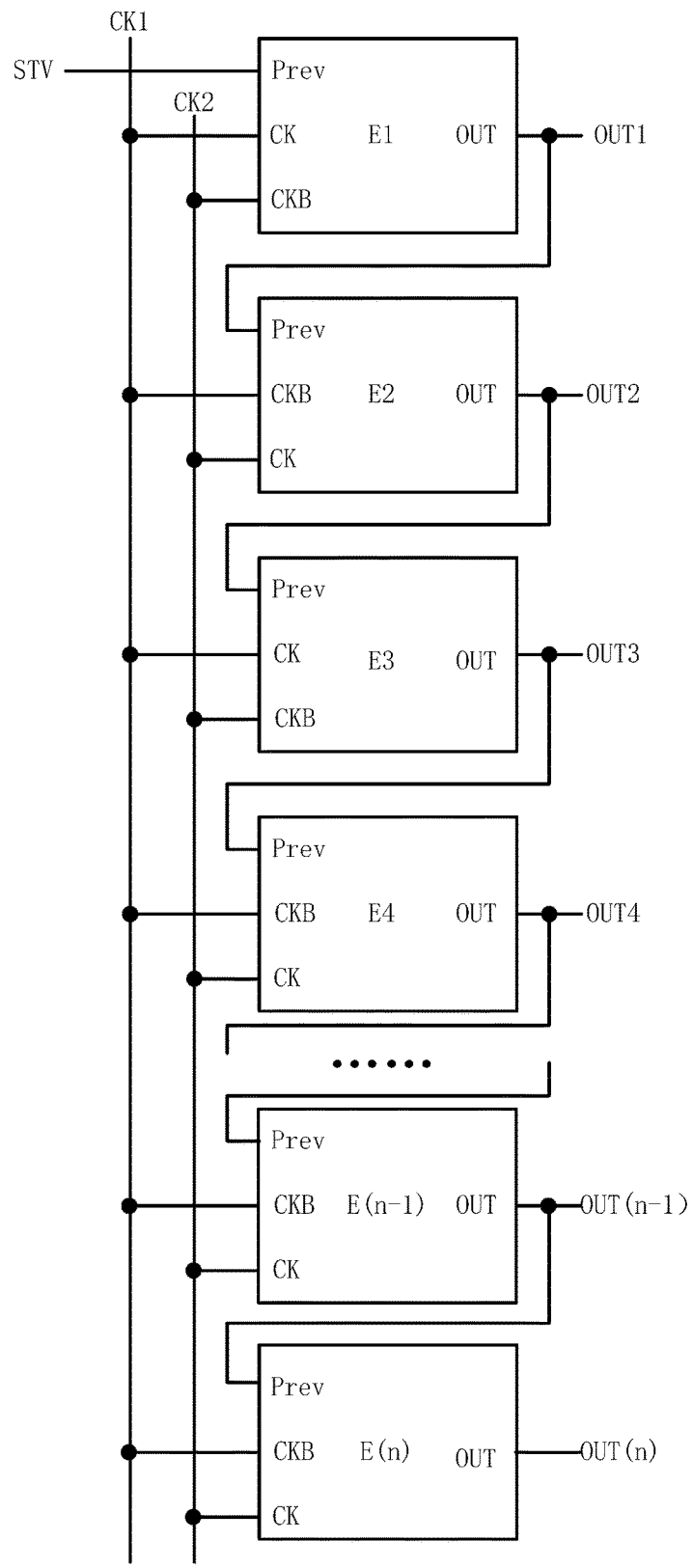
FIG. 12 illustrates a structural schematic diagram of a cascade of light-emitting control signal generation circuits according to the embodiments of the present disclosure.

With reference to FIG. 12 according to some optional embodiments of the present disclosure, it illustrates a structural schematic diagram of a cascade of light-emitting control signal generation circuits. The present disclosure also provides an exemplary display panel including the cascade of light-emitting control signal generation circuits as described herein.

It should be noted that except for last level of light-emitting signal generation circuit within the cascade, a signal output terminal OUT of each level of light-emitting signal generation circuit is electrically connected to a signal input terminal Prev of next level of light-emitting signal generation circuit, and an initiating pulse signal STV is supplied to a signal input terminal Prev of a first level of light-emitting signal generation circuit. For example, a signal input terminal Prev of first level of light-emitting signal generation circuit E1 receives an initial pulse signal STV, and a signal input terminal Prev of last level of light-emitting signal generation circuit E(n) receives an effective pulse signal outputted by a signal output terminal OUT(n-1) of previous level of light-emitting signal generation circuit E(n-1).

The exemplary display panel according to the embodiments of the present disclosure, by arranging the cascade of different levels of light-emitting control signal generation circuits, ensures that a pulse width of an output signal outputted by first level of light-emitting control signal generation circuit E1 determines pulse widths of output signals outputted by all other levels of light-emitting control signal generation circuits. Since the pulse width of the output signal outputted by first level of light-emitting control signal generation circuit E1 is determined by a pulse width of the initial pulse signal, the generated light-emitting control signal after such adjustment may have a stable potential, thereby improving the quality and flexibility of display images while reducing the power consumption of the display system.

In order to effectively control various levels of light-emitting control signal generation circuits, to output light-emitting control signals as well as decrease the numbers and occupation areas of wires for a narrow-frame design, the exemplary display panel according to the present disclosure may only arrange two clock signal lines. Each clock signal line may provide clock signals for the cascade of light-emitting control signal generation circuits, respectively. With reference to FIG. 12 particularly, a first clock signal terminal CK of each odd-numbered level of light-emitting control signal generation circuit is electrically connected to a first clock signal wire CK1, and a second clock signal terminal CKB of each odd-numbered level of light-emitting control signal generation circuit is electrically connected to a second clock signal wire CK2. Meanwhile, a first clock signal terminal CK of each even-numbered level of light-emitting control signal generation circuit is electrically connected to the second clock signal wire CK2, and a second clock signal terminal CKB of each even-numbered level of light-emitting control signal generation circuit is electrically connected to the first clock signal wire CK1.

With reference to the light-emitting control signal generation circuits as illustrated in FIG. 12 for example, for first level of light-emitting control signal generation circuit E1 and third level of light-emitting control signal generation circuit E3, respectively, their first clock signal terminals CK are electrically connected to the first clock signal wire CK1, and their second clock signal terminals CKB are electrically connected to the second clock signal wire CK2. For second level of light-emitting control signal generation circuit E2 and fourth level of light-emitting control signal generation circuit E4, respectively, their first clock signal terminals CK are electrically connected to the second clock signal wire CK2, and their second clock signal terminals CKB are electrically connected to the first clock signal wires CK1 and so on, for which the detailed description will not be repeated herein.

Figure 13:
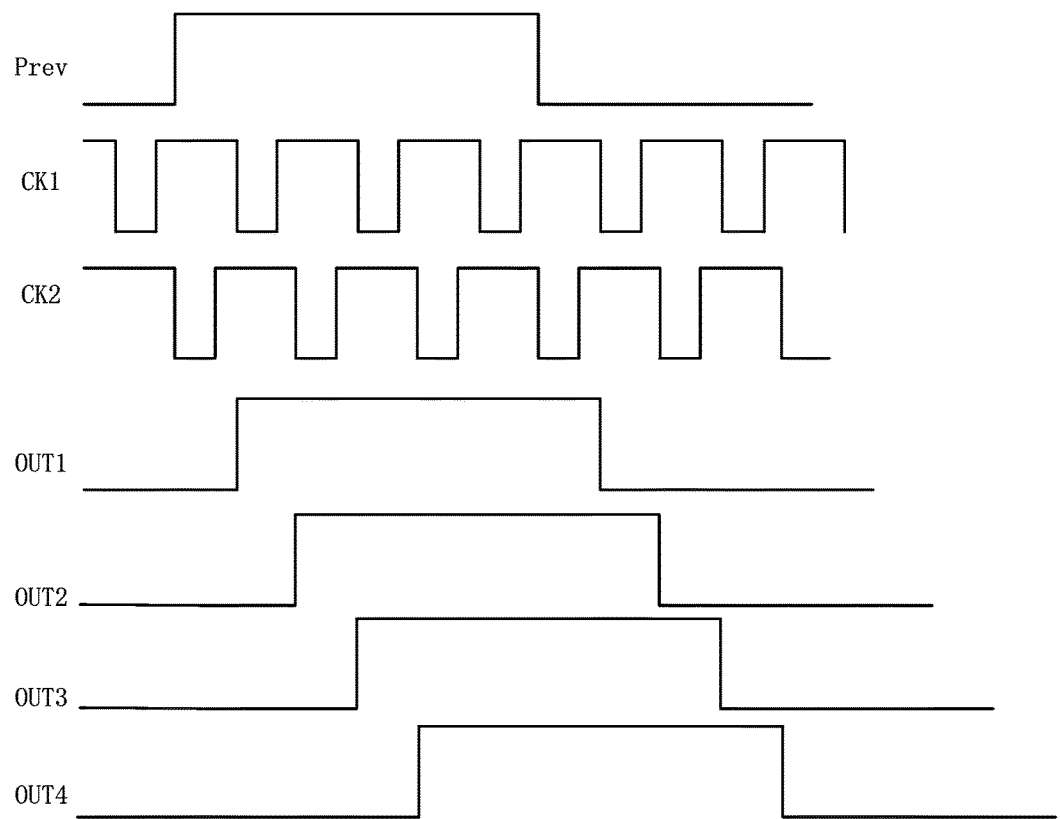
FIG. 13 illustrates an input and output timing diagram corresponding to the cascade of light-emitting control signal generation circuits as illustrated in FIG. 12 according to the embodiments of the present disclosure.

With reference to FIG. 13 according to some optional embodiments of the present disclosure, it illustrates an input and output timing diagram corresponding to the cascade of light-emitting control signal generation circuits as illustrated in FIG. 12. A signal output terminal of each level of light-emitting control signal generation circuit supplies an effective pulse signal to a signal input terminal of next level of light-emitting control signal generation circuit. For example, a signal output terminal OUT1 of first level of light-emitting control signal generation circuit E1 supplies an effective pulse signal to a signal input terminal Prev of second level of light-emitting control signal generation circuit E2. Based on the received pulse signal as well as the timings of the first clock signal and the second clock signal, second level of light-emitting control signal generation circuit E2 outputs a light-emitting control signal. Referring to the foregoing embodiments of the present disclosure, the detailed description will not be further repeated herein.

Figure 14:
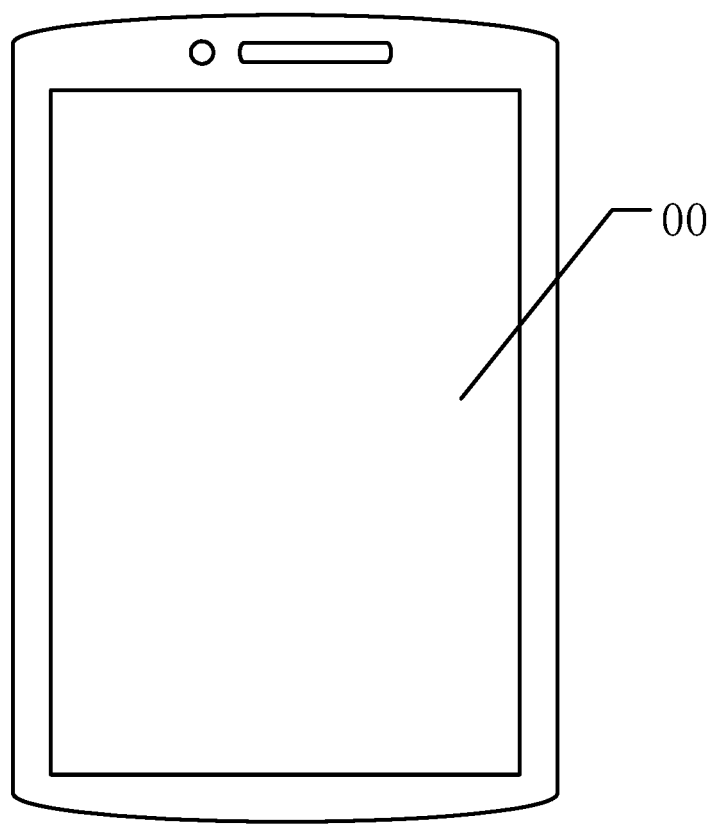
FIG. 14 illustrates a structural schematic diagram of a display apparatus according to the embodiments of the present disclosure.

With reference to FIG. 14 according to some optional embodiments of the present disclosure, it illustrates a structural schematic diagram of an exemplary display apparatus 01. The exemplary display apparatus 01 may include the exemplary display panel 00 as described in the foregoing embodiments. A mobile phone illustrated in FIG. 14 is merely for exemplary purposes, to describe the display apparatus 01 according to the embodiments of the present disclosure. It should be understood that the display apparatus 01 may be computers, televisions, vehicle display devices and other display apparatuses with display functions, not limited by the embodiments of the present disclosure. The display apparatus 01 described in the exemplary embodiments of the present disclosure may possess the beneficial effects of the display panel 00, referring to the corresponding explanations in the foregoing description. To avoid redundancy, it may not be further described herein.

As described above, the light-emitting control signal generation circuit, the display panel and the display apparatus may possess at least the beneficial effects in the following.

Figure 15:
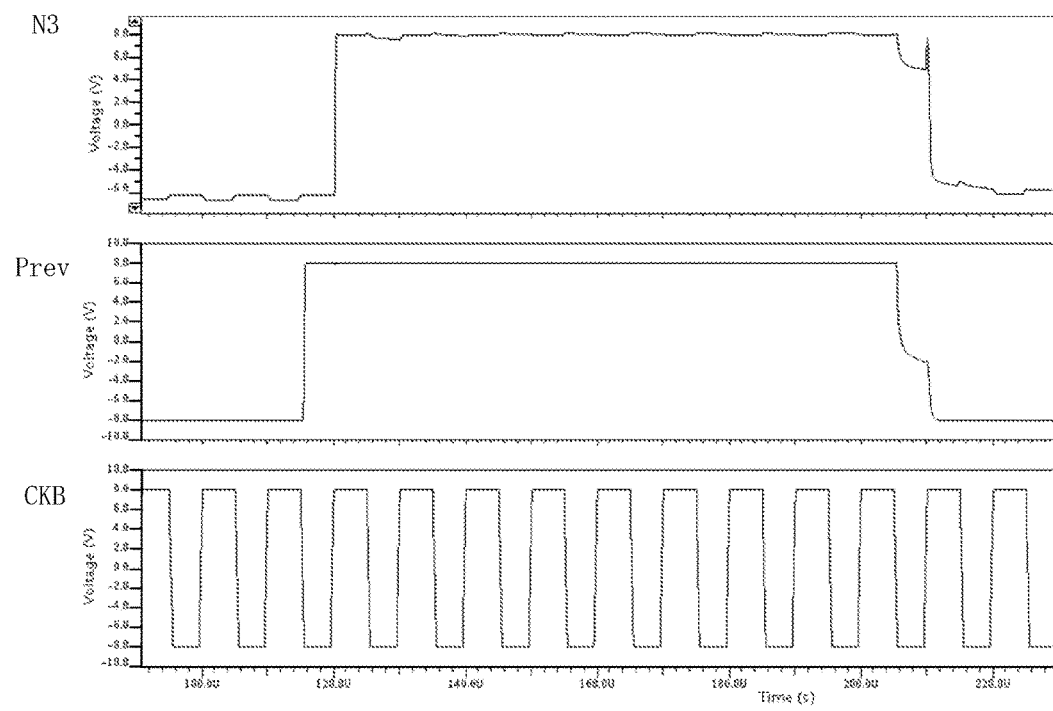
FIG. 15 illustrates simulation results corresponding to an exemplary light-emitting control signal generation circuit in lack of an interlocking stabilization module according to the embodiments of the present disclosure.

The light-emitting control signal generation circuit has a simple circuit structure, with the first control module 1, the second control module 2 and the output module 4 coordinating one another, such that the signal output terminal OUT outputs a signal having the same pulse width as the effective input pulse signal inputted by the signal input terminal Prev. By adjusting the pulse with of the effective input pulse signal, the pulse width of the output signal may be adjusted accordingly, thereby fulfilling various display needs for different brightness of the display panel. Furthermore, the circuit structure of the interlocking stabilization module 3 may maintain the pulse width of the scanning signal and the stability of the potential, thereby maintaining the pulse width of the light-emitting control signal and the stability of the potential. Based on such, a display image of the display panel may have better quality and improved watching experience. For example, the fourteenth switching transistor T14 in the interlocking stabilization module 3 may be used to stabilize the potential of the third node N3. With reference to FIG. 15, it illustrates simulation results corresponding to the potential of the third node N3 in a light-emitting control signal generation circuit in lack of an interlocking stabilization module 3 according to the embodiments of the present disclosure. As can be seen, after the signal input terminal Prev is supplied with a falling-edge signal with a low potential, the first switching transistor T1 is turned on, such that the first capacitor C1 feeds through the second clock signal inputted by the second clock signal terminal CKB. Accordingly, the potential of the third node N3 is decreased which causes the sixth switching transistor T6 to turn on in advance. Therefore, the signal output terminal OUT outputs the first voltage signal inputted by the first voltage signal terminal VGL too early, namely, a falling-edge appears in advance. Hence, the fourteenth switching transistor T14 may be used to stabilize the potential of the third node N3, thereby preventing the first capacitor C1 from feeding through and turning on the sixth switching transistor T6 in advance. Besides, it may also avoid the shortening of the pulse signal outputted by the signal output terminal OUT, thereby ensuring the stability of the pulse width and potential of the light-emitting control signal. Furthermore, by arranging the relationship among different levels of light-emitting control signal generation circuits within the cascade, the pulse width of the output signal outputted by first level of light-emitting control signal generation circuit E1 may determine pulse widths of the output signals outputted by all other levels of light-emitting control signal generation circuits. Since the pulse width of the output signal outputted by first level of light-emitting control signal generation circuit E1 is determined by the pulse width of the initial pulse signal, the generated light-emitting control signal after such adjustment may have a stable potential, thereby improving the quality and flexibility of the display images, while reducing the power consumption of the display system.

As disclosed herein, the light-emitting control signal generation circuit, the display panel and display the apparatus may have at least the beneficial effects listed in the following.

For example, the light-emitting control signal generation circuit has a simple circuit structure, with the first control module, the second control module and the output module coordinating one another, such that a signal outputted by the signal output terminal may have a same pulse width as the effective pulse signal inputted by the signal input terminal. By adjusting the pulse with of the effective input pulse signal, the pulse width of the output signal may be adjusted accordingly, thereby fulfilling various display needs for different brightness of the display panel. Furthermore, the circuit structure of the interlocking stabilization module may maintain the stability of a pulse width and potential of a scanning signal, thereby maintaining the stability of the pulse width and potential of the light-emitting control signal. As such, the display panel may have display images with better qualities and improved watching experience. Besides of the improvement in the quality of the display image, it may also improve the flexibility of display images and reduce the power consumption of the display system.

Apparently, it is unnecessary for any one of the various embodiments of the present disclosure to simultaneously achieve each of the beneficial effects as disclosed above.

Although the present disclosure has been described in detail with reference to the foregoing embodiments, it is readily apparent to one ordinary skill in the art that the foregoing embodiments as described are merely for explanatory purpose, and not intended to be limiting. It is also apparent to one ordinary skill in the art that these embodiments may be modified or substituted, without departing from the scope of the various embodiments of the present disclosure. Instead, the scope of the present disclosure is defined by appended claims.

What is claimed is:

1. A light-emitting control signal generation circuit, comprising:
   a first control module;

an interlocking stabilization module;
a second control module; and
an output module, wherein:
the first control module is configured to control a potential of a first node, under a control of an effective pulse signal inputted by a signal input terminal, a first clock signal inputted by a first clock signal terminal and a second clock signal inputted by a second clock signal terminal,
the second control module is configured to control a potential of a second node, under a control of the first clock signal inputted by the first clock signal terminal, the second clock signal inputted by the second clock signal terminal, a first voltage signal inputted by a first voltage signal terminal, a second voltage signal inputted by a second voltage signal terminal and the potential of the first node,
the interlocking stabilization module is configured to stably control a potential of a third node, under a control of the second voltage signal inputted by the second voltage signal terminal, and
the output module is configured to transmit the first voltage signal inputted by the first voltage signal terminal to a signal output terminal under a control of the potential of the first node and the potential of the third node, and to transmit the second voltage signal inputted by the second voltage signal terminal to the signal output terminal under a control of the potential of the second node.

2. The light-emitting control signal generation circuit according to claim 1, wherein:
the effective pulse signal inputted by the signal input terminal has a high level signal, and
a rising edge and a falling edge of an effective pulse signal outputted by the signal output terminal are aligned with a falling edge of the first clock signal inputted by the first clock signal terminal.

3. The light-emitting control signal generation circuit according to claim 1, wherein:
a pulse width of the effective pulse signal inputted by the signal input terminal is an integer multiple of a pulse width of a clock signal cycle inputted by the first clock signal terminal and the second clock signal terminal.

4. The light-emitting control signal generation circuit according to claim 1, wherein:
the effective pulse signal inputted by the signal input terminal has an extending cycle same as an effective pulse signal outputted by the signal output terminal.

5. The light-emitting control signal generation circuit according to claim 1, wherein:
the first voltage signal inputted by the first voltage signal terminal has a low level and the second voltage signal inputted by the second voltage signal terminal has a high level.

6. The light-emitting control signal generation circuit according to claim 1, wherein:
the first control module includes a first control unit and a charge pump unit,
a first terminal of the first control unit is electrically connected to the signal input terminal, a second terminal of the first control unit is electrically connected to the first clock signal terminal, and a third terminal of the first control unit is electrically connected to the first node,
the first control unit, under a control of the first clock signal inputted by the first clock signal terminal, is configured to transmit the effective pulse signal inputted by the signal input terminal to the first node,
a first terminal of the charge pump unit is electrically connected to the second clock signal terminal, and a second terminal of the charge pump unit is electrically connected to the first node, and
the charge pump unit, under a control of the second clock signal inputted by the second clock signal terminal, is configured to strengthen the potential of the first node.

7. The light-emitting control signal generation circuit according to claim 6, wherein:
the first control unit includes a second switching transistor, wherein a gate electrode of the second switching transistor is electrically connected to the first clock signal terminal, a source electrode of the second switching transistor is electrically connected to the signal input terminal, and a drain electrode of the second switching transistor is electrically connected to the first node, and
the charge pump unit includes a first capacitor, wherein a first terminal of the first capacitor is electrically connected to the first node, and a second terminal of the first capacitor is electrically connected to the second clock signal terminal.

8. The light-emitting control signal generation circuit according to claim 7, wherein:
the charge pump unit further includes a first switching transistor, wherein a gate electrode of the first switching transistor is electrically connected to the signal input terminal, a source electrode of the first switching transistor is electrically connected to the second clock signal terminal, and a drain electrode of the first switching transistor is electrically connected to the second terminal of the first capacitor, and
the first switching transistor, under a control of the effective pulse signal inputted by the signal input terminal, is configured to transmit the second clock signal inputted by the second clock signal terminal to the second terminal of the first capacitor, thereby strengthening the potential of the first node.

9. The light-emitting control signal generation circuit according to claim 6, wherein:
the first control unit further includes a current-limiting unit, wherein:
a first terminal of the current-limiting unit is electrically connected to the first voltage signal terminal, a second terminal of the current-limiting unit is electrically connected to the third node, and a third terminal of the current-limiting unit is electrically connected to the first node, and
the current-limiting unit, under a control of the first voltage signal inputted by the first voltage signal terminal, is configured to conduct the third terminal of the first control unit with the first node.

10. The light-emitting control signal generation circuit according to claim 9, wherein:
the current-limiting unit includes an eleventh switching transistor and a second capacitor, wherein:
a gate electrode of the eleventh switching transistor is electrically connected to the first voltage signal terminal, a source electrode of the eleventh switching transistor is electrically connected to the third node, and further electrically connected to the gate electrode of the eleventh switching transistor through the second capacitor, and a drain electrode of the eleventh switching transistor is electrically connected to the first node.

11. The light-emitting control signal generation circuit according to claim 1, wherein:
  the second control module includes a second control unit, a third control unit and a fourth control unit, wherein:
  a first terminal of the second control unit is electrically connected to the first clock signal terminal, a second terminal of the second control unit is electrically connected to the first node, and a third terminal of the second control unit is electrically connected to a fourth node,
  the second control unit is configured to transmit the first clock signal inputted by the first clock signal terminal to the fourth node, under a control of the first clock signal inputted by the first clock signal terminal, and to transmit the first clock signal inputted by the first clock signal terminal to the fourth node, under a control of the potential of the first node,
  a first terminal of the third control unit is electrically connected to the fourth node, a second terminal of the third control unit is electrically connected to the first clock signal terminal, a third terminal of the third control unit is electrically connected to the second voltage signal terminal, a fourth terminal of the third control unit is electrically connected to the second clock signal terminal, and a fifth terminal of the third control unit is electrically connected to the fifth node,
  the third control unit is configured to transmit the second clock signal inputted by the second clock signal terminal to the fifth node, under a control of the first clock signal inputted by the first clock signal terminal, and to transmit the second clock signal inputted by the second clock signal terminal to the fifth node, under a control of a potential of the fourth node,
  a first terminal of the fourth control unit is electrically connected to the fifth node, a second terminal of the fourth control unit is electrically connected to the first voltage signal terminal, and a third terminal of the fourth control unit is electrically connected to the second node, and
  the fourth control unit, under a control of a potential of the fifth node, is configured to transmit the first voltage signal inputted by the first voltage signal terminal to the second node.

12. The light-emitting control signal generation circuit according to claim 11, wherein:
  the second control unit includes a ninth switching transistor and a tenth switching transistor, wherein a gate electrode and a source electrode of the ninth switching transistor are electrically connected to the first clock signal terminal, a drain electrode of the ninth switching transistor is electrically connected to the fourth node, a gate electrode of the tenth switching transistor is electrically connected to the first node, a source electrode of the tenth switching transistor is electrically connected to the first clock signal terminal, and a drain electrode of the tenth switching transistor is electrically connected to the fourth node,
  the third control unit includes a third switching transistor, an eighth switching transistor and a fourth capacitor, wherein a gate electrode of the third switching transistor is electrically connected to the first clock signal terminal, a source electrode of the third switching transistor is electrically connected to the second voltage signal terminal, a drain electrode of the third switching transistor is electrically connected to the fifth node, a gate electrode of the eighth switching transistor is electrically connected to the fourth node, a source electrode of the eighth switching transistor is electrically connected to the second clock signal terminal, a drain electrode of the eighth switching transistor is electrically connected to the fifth node, and further electrically connected to the gate electrode of the eighth switching transistor through the fourth capacitor, and
  the fourth control unit includes a seventh switching transistor, wherein a gate electrode of the seventh switching transistor is electrically connected to the fifth node, a source electrode of the seventh switching transistor is electrically connected to the first voltage signal terminal, and a drain electrode of the seventh switching transistor is electrically connected to the second node.

13. The light-emitting control signal generation circuit according to claim 12, wherein:
  the ninth switching transistor and the tenth switching transistor are double-gate switching transistors.

14. The light-emitting control signal generation circuit according to claim 1, wherein:
  the interlocking stabilization module includes a fifth control unit and a sixth control unit, wherein:
  a first terminal of the fifth control unit is electrically connected to the second control module, a second terminal of the fifth control unit is electrically connected to the second voltage signal terminal, and a third terminal of the fifth control unit is electrically connected to the third node,
  the fifth control unit, under a control of the second control module, is configured to transmit the second voltage signal inputted by the second voltage signal terminal to the third node, thereby stabilizing the potential of the third node,
  a first terminal of the sixth control unit is electrically connected to the third node, a second terminal of the sixth control unit is electrically connected to the second voltage signal terminal, and a third terminal of the sixth control unit is electrically connected to the second node, and
  the sixth control unit, under a control of the potential of the third node, is configured to transmit the second voltage signal inputted by the second voltage signal terminal to the second node.

15. The light-emitting control signal generation circuit according to claim 14, wherein:
  the fifth control unit includes a fourteenth switching transistor, wherein a gate electrode of the fourteenth switching transistor is electrically connected to the second control module, a source electrode of the fourteenth switching transistor is electrically connected to the second voltage signal terminal, and a drain electrode of the fourteenth switching transistor is electrically connected to the third node, and
  the sixth control unit includes a fourth switching transistor, wherein a gate electrode of the fourth switching transistor is electrically connected to the third node, a source electrode of the fourth switching transistor is electrically connected to the second voltage signal terminal, and
  a drain electrode of the fourth switching transistor is electrically connected to the second node.

16. The light-emitting control signal generation circuit according to claim 1, wherein:
  the output module includes a first output unit and a second output unit, wherein:
  a first terminal of the first output unit is electrically connected to the first node, a second terminal of the first output unit is electrically connected to the first voltage signal terminal, and a third terminal of the first output unit is electrically connected to the signal output terminal, the first output unit, under the control of the potential of the first node, is configured to transmit the first voltage signal inputted by the first voltage signal terminal to the signal output terminal, a first terminal of the second output unit is electrically connected to the second node, a second terminal of the second output unit is electrically connected to the second voltage signal terminal, and a third terminal of the second output unit is electrically connected to the signal output terminal, and the second output unit, under a control of the potential of the second node, is configured to transmit the second voltage signal inputted by the second voltage signal terminal to the signal output terminal.

17. The light-emitting control signal generation circuit according to claim 16, wherein:

the first output unit includes a sixth switching transistor, wherein a gate electrode of the sixth switching transistor is electrically connected to the first node, a source electrode of the sixth switching transistor is electrically connected to the first voltage signal terminal, and a drain electrode of the sixth switching transistor is electrically connected to the signal output terminal, and the second output unit includes a fifth switching transistor and a third capacitor, wherein a gate electrode of the fifth switching transistor is electrically connected to the second node and further electrically connected to the second voltage signal terminal through the third capacitor, a source electrode of the fifth switching transistor is electrically connected to the second voltage signal terminal, and a drain electrode of the fifth switching transistor is electrically connected to the signal output terminal.

18. A display panel comprising a cascade circuit including a plurality of light-emitting control signal generation circuits including a light-emitting control signal generation circuit, wherein the light-emitting control signal generation circuit comprises:

a first control module;
an interlocking stabilization module;
a second control module; and
an output module, wherein:

the first control module is configured to control a potential of a first node, under a control of an effective pulse signal inputted by a signal input terminal, a first clock signal inputted by a first clock signal terminal and a second clock signal inputted by a second clock signal terminal, the second control module is configured to control a potential of a second node, under a control of the first clock signal inputted by the first clock signal terminal, the second clock signal inputted by the second clock signal terminal, a first voltage signal inputted by a first voltage signal terminal, a second voltage signal inputted by a second voltage signal terminal and the potential of the first node, the interlocking stabilization module is configured to stably control a potential of a third node, under a control of the second voltage signal inputted by the second voltage signal terminal, and the output module is configured to transmit the first voltage signal inputted by the first voltage signal terminal to a signal output terminal under a control of the potential of the first node and the potential of the third node, and to transmit the second voltage signal inputted by the second voltage signal terminal to the signal output terminal under a control of the potential of the second node;

wherein:

except for a last level of the light-emitting signal generation circuit in the cascade circuit, a signal output terminal of each level of the light-emitting signal generation circuit is electrically connected to a signal input terminal of a next level of the light-emitting signal generation circuit, and an initiating pulse signal is supplied to a signal input terminal of a first level of the light-emitting signal generation circuit.

19. The display panel according to claim 18, wherein:

a first clock signal terminal of each odd-numbered level of light-emitting control signal generation circuit is electrically connected to a first clock signal wire, and a second clock signal terminal of the each odd-numbered level of light-emitting control signal generation circuit is electrically connected to a second clock signal wire, and a first clock signal terminal of each even-numbered level of light-emitting control signal generation circuit is electrically connected to the second clock signal wire, and a second clock signal terminal of the each even-numbered level of light-emitting control signal generation circuit is electrically connected to the first clock signal wire.

20. A display apparatus comprises a display panel, wherein the light-emitting control signal generation circuit, comprising:

a first control module;
an interlocking stabilization module;
a second control module; and
an output module, wherein:

the first control module is configured to control a potential of a first node, under a control of an effective pulse signal inputted by a signal input terminal, a first clock signal inputted by a first clock signal terminal and a second clock signal inputted by a second clock signal terminal, the second control module is configured to control a potential of a second node, under a control of the first clock signal inputted by the first clock signal terminal, the second clock signal inputted by the second clock signal terminal, a first voltage signal inputted by a first voltage signal terminal, a second voltage signal inputted by a second voltage signal terminal and the potential of the first node, the interlocking stabilization module is configured to stably control a potential of a third node, under a control of the second voltage signal inputted by the second voltage signal terminal, and the output module is configured to transmit the first voltage signal inputted by the first voltage signal terminal to a signal output terminal under a control of the potential of the first node and the potential of the third node, and to transmit the second voltage signal inputted by the second voltage signal terminal to the signal output terminal under a control of the potential of the second node.

* * * * *